US012620556B2

(12) United States Patent
Kawanabe et al.

(10) Patent No.: US 12,620,556 B2
(45) Date of Patent: May 5, 2026

(54) PLASMA PROCESSING APPARATUS

(71) Applicant: HITACHI HIGH-TECH CORPORATION, Tokyo (JP)

(72) Inventors: Tetsuo Kawanabe, Tokyo (JP); Makoto Satake, Tokyo (JP); Motohiro Tanaka, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/763,301

(22) PCT Filed: Feb. 19, 2021

(86) PCT No.: PCT/JP2021/006280
§ 371 (c)(1),
(2) Date: Mar. 24, 2022

(87) PCT Pub. No.: WO2022/176147
PCT Pub. Date: Aug. 25, 2022

(65) Prior Publication Data
US 2024/0014010 A1     Jan. 11, 2024

(51) Int. Cl.
H01J 37/32 (2006.01)

(52) U.S. Cl.
CPC .. H01J 37/32247 (2013.01); H01J 37/32192 (2013.01); H01J 37/32229 (2013.01);
(Continued)

(58) Field of Classification Search
CPC ......... H01J 37/32192–32311; C23C 16/45565
See application file for complete search history.

(56) References Cited

U.S. PATENT DOCUMENTS 5,804,033 A * 9/1998 Kanai ............... H01J 37/32266
427/457
6,050,506 A * 4/2000 Guo ...................... C23C 16/455
239/560
(Continued)

FOREIGN PATENT DOCUMENTS

CN        102473629 A      5/2012
JP        H09148097 A      6/1997
(Continued)

OTHER PUBLICATIONS

Search Report mailed Apr. 13, 2021 in International Application No. PCT/JP2021/006280.
(Continued)

*Primary Examiner* — Kurt Sweely
(74) *Attorney, Agent, or Firm* — Miles & Stockbridge, P.C.

(57) ABSTRACT

A plasma processing apparatus includes: a processing chamber in which a sample is subjected to plasma processing, including, at an upper side therein, a dielectric plate, through which microwaves are transmitted; a radio frequency power supply which supplies radio frequency power for the microwaves; a cavity resonator which resonates microwaves transmitted from the radio frequency power supply through a waveguide and is placed above the dielectric plate; and a magnetic field forming mechanism which forms a magnetic field in the processing chamber. The plasma processing apparatus further includes: a ring-shaped conductor placed inside the cavity resonator; and a circular conductor which is placed inside the cavity resonator and placed in an opening at the center of the ring-shaped conductor.

8 Claims, 15 Drawing Sheets

(52) U.S. Cl.
CPC ... *H01J 37/32238* (2013.01); *H01J 37/32201* (2013.01); *H01J 37/3244* (2013.01)

(56) References Cited

U.S. PATENT DOCUMENTS

| | | | | |
|---|---|---|---|---|
| 6,158,383 A * | 12/2000 | Watanabe | ......... | H01J 37/32192 |
| | | | | 118/723 AN |
| 6,343,565 B1 * | 2/2002 | Hongoh | ................ | C23C 16/511 |
| | | | | 315/111.21 |
| 6,388,632 B1 * | 5/2002 | Murakawa | ........... | H01Q 21/064 |
| | | | | 118/723 MW |
| 6,427,621 B1 * | 8/2002 | Ikegawa | ........... | H01J 37/32192 |
| | | | | 156/345.47 |
| 6,622,650 B2 * | 9/2003 | Ishii | .................. | H01J 37/32192 |
| | | | | 118/723 AN |
| 6,911,617 B2 * | 6/2005 | Ishii | .................. | H01J 37/32293 |
| | | | | 219/121.36 |

| | | | | |
|---|---|---|---|---|
| 2011/0039355 A1 * | 2/2011 | Zhao | ................... | H01J 37/3244 |
| | | | | 257/E21.528 |
| 2016/0358757 A1 * | 12/2016 | Ikeda | ................ | H01J 37/32266 |
| 2019/0164725 A1 * | 5/2019 | Kawakami | ........ | H01L 21/02274 |

FOREIGN PATENT DOCUMENTS

| | | | | |
|---|---|---|---|---|
| JP | H1083896 | A | * | 3/1998 |
| JP | 2000306890 | A | | 11/2000 |
| JP | 2012134235 | A | | 7/2012 |
| JP | 2013211270 | A | | 10/2013 |
| JP | 2019110028 | A | | 7/2019 |

OTHER PUBLICATIONS

Written Opinion mailed Apr. 13, 2021 in International Application No. PCT/JP2021/006280.
Office Action mailed Jun. 27, 2025 in Chinese Application No. 202180005217.X.

* cited by examiner

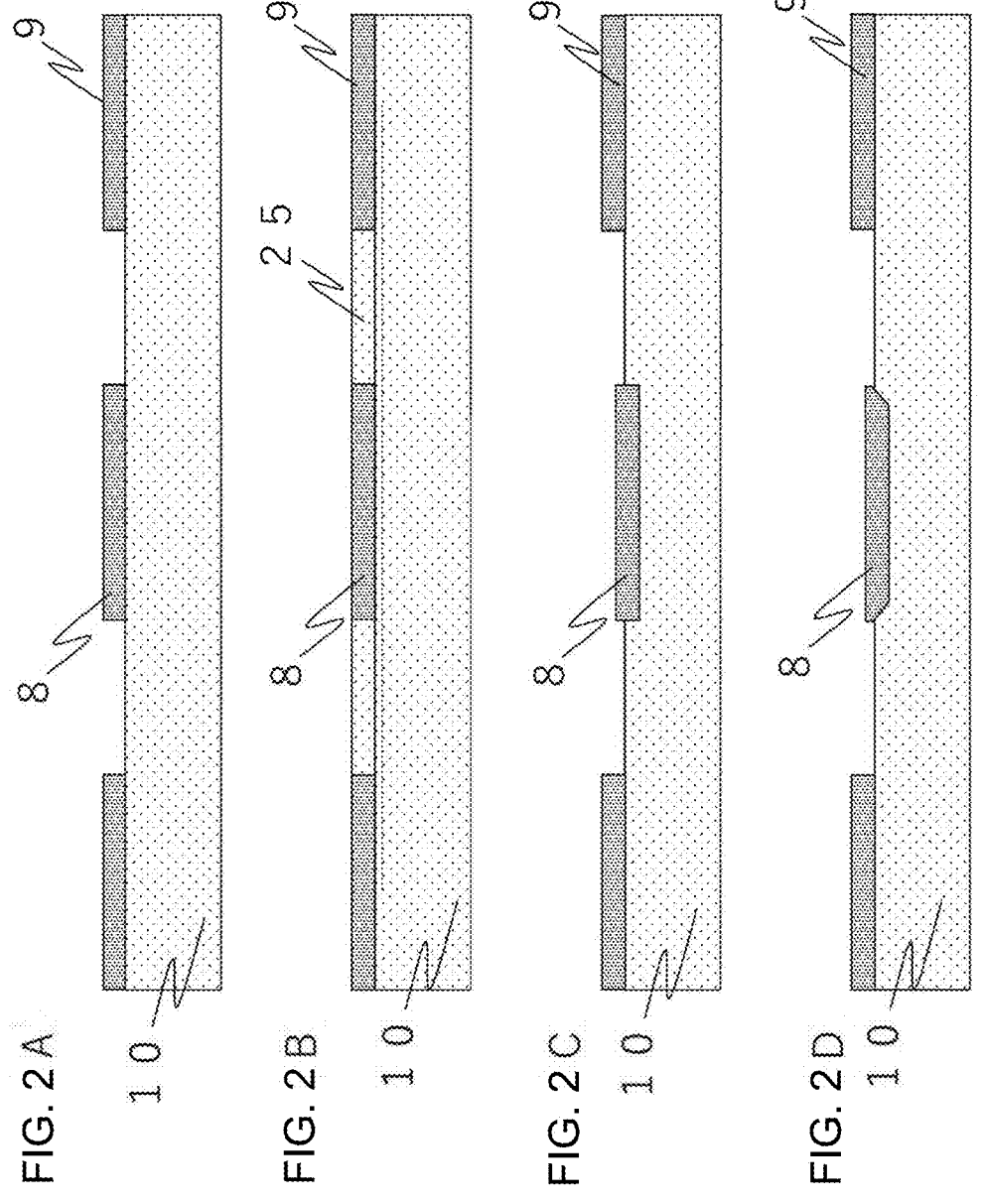

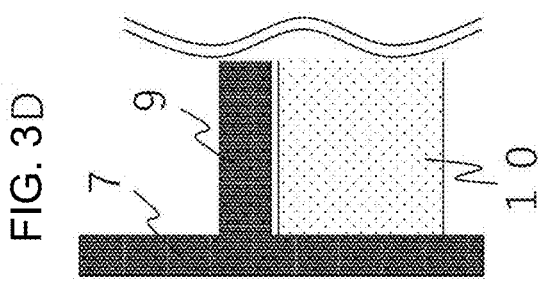
FIG. 3D
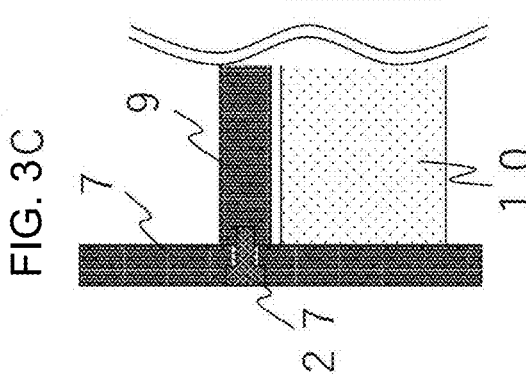
FIG. 3C
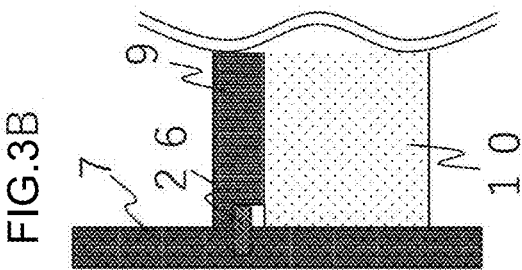
FIG.3B
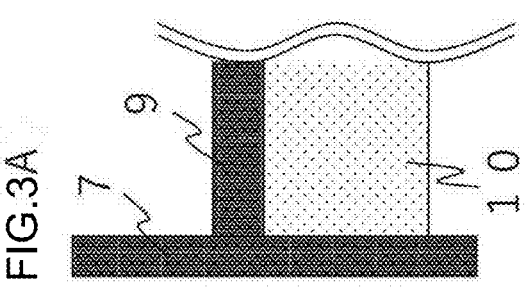
FIG.3A
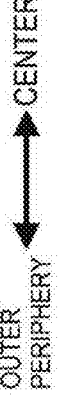
OUTER PERIPHERY ← → CENTER

PLASMA PROCESSING APPARATUS

TECHNICAL FIELD

The present invention relates to a plasma processing apparatus.

BACKGROUND ART

In the manufacture of semiconductor devices, plasma processing such as plasma etching, plasma CVD (Chemical Vapor Deposition), and plasma aching is widely used. In an etching apparatus, which is one of plasma processing apparatuses, there is a demand that anisotropic processing and isotropic processing be performed by a single apparatus from the viewpoint of mass productivity of devices.

The anisotropic processing can be achieved by ion-assisted reactions, which are dependent mainly on ions that are vertically incident on a wafer, and isotropic processing can be achieved by chemical reactions, which are dependent mainly on radicals isotropically diffusing and incident on a wafer. In general, at a low pressure, ion density increases and ion-based etching is promoted, and at a high pressure, radical density increases and radical-based etching is promoted. Therefore, it is desirable for such an etching apparatus to be capable of processing in a wide pressure range from a low pressure of approximately 0.1 Pa to a high pressure of several tens of Pa. Further, in order to ensure mass productivity of devices, it is necessary to perform uniform etching in a wafer surface over such a wide pressure range.

As a plasma generation method, an ECR (Electron Cyclotron Resonance) method, an inductive coupling method, a capacitive coupling method, and the like are known. The ECR is a resonance phenomenon that occurs when there is a match between an electromagnetic wave frequency introduced from an electromagnetic wave generation source and a cyclotron frequency of electrons by a magnetic field formed by an electromagnetic coil. Plasma is generated when high-energy electrons accelerated by the ECR collide with gas molecules and are ionized. One advantage of the ECR method is that plasma can be efficiently and uniformly generated even in a low pressure range of 1 Pa or less, which is difficult to achieve by a plasma generation method such as the inductive coupling method or the capacitive coupling method.

If the pressure in a discharge chamber is relatively low, the mean free path of electrons is long, so that electrons are sufficiently accelerated by ECR before colliding with gas molecules and becoming ionized, thus efficiently generating plasma in the vicinity of an isomagnetic field surface that satisfies ECR conditions. Normally, an isomagnetic field surface that satisfies the ECR conditions spreads out in a plane shape in a discharge chamber, so that an area where plasma is generated spreads out in a planar or ring shape in the discharge chamber. Consequently, relatively uniform plasma processing can be achieved.

However, if the pressure in the discharge chamber is high, the mean free path of electrons is short, so that the electrons that receive energy from electromagnetic waves immediately collide with gas molecules and ionize or dissociate. Therefore, the area where plasma is generated will be localized in the vicinity of a central axis of the discharge chamber directly under a microwave introduction window, through which electromagnetic waves enter, and directly under a waveguide rather than in the vicinity of the isomagnetic field surface that satisfies the ECR conditions. This poses a problem in that, under a high-pressure condition, the distribution of an etching rate tends to be uneven, with a higher rate at a center.

As a prior art for suppressing the localization of plasma generation at the central part of a discharge chamber, there is one disclosed in, for example, Patent Document 1. The plasma processing apparatus using the ECR method of Patent Document 1 has a microwave introduction window placed between a discharge chamber and an electromagnetic wave transmission unit, and an electromagnetic wave reflector and an auxiliary reflector placed under a microwave introduction window. Electromagnetic waves are emitted into the discharge chamber through a ring-shaped electromagnetic wave emission port, which is formed between the electromagnetic wave reflector and the auxiliary reflector, to cause ring-shaped plasma to occur on an ECR surface so as to form uniform plasma, thus achieving plasma processing with high uniformity.

Further, Patent Document 2 relates to a plasma processing apparatus of a type that generates microwave plasma without a magnetic field. The plasma processing apparatus includes a waveguide, through which microwaves propagate, an introduction window of microwaves introduced into a processing container, an annular ring slot placed between the waveguide and the microwave introduction window, and a shielding plate that is placed on the processing container side of the microwave introduction window and shields the electric field of microwaves transmitted through the microwave introduction window. By providing the shielding plate, the plasma density at the central part in the processing container is reduced, and the nonuniformity of plasma processing in a sample surface is reduced.

Further, Patent Document 3 discloses a method for forming second plasma at the central part of a space in the microwave introduction window in addition to first plasma in a processing chamber. By setting the density of the second plasma to be equal to or higher than a cutoff density, the second plasma acts like an electromagnetic wave reflector, and electromagnetic waves can be transmitted by not generating the second plasma. Consequently, by adjusting the second plasma density, the nonuniformity of plasma processing is reduced under various conditions.

CITATION LIST

Patent Documents

Patent Document 1: Japanese Patent Application Laid-Open No. 9-148097
Patent Document 2: Japanese Patent Application Laid-Open No, 2013-211270
Patent Document 3: Japanese Patent Application Laid-Open No. 2019-110028

SUMMARY OF THE INVENTION

Problem to be Solved by the Invention

In an ECR plasma etching apparatus using microwaves, it is difficult to achieve uniform distribution of the plasma processing characteristics, such as etching rate, in a wafer surface over a wide pressure range. This has been especially difficult to achieve in a high-pressure range of several Pa or higher.

A reason why it is difficult to achieve uniform plasma processing at a high pressure is that the localization of plasma generation and isotropic diffusion are dominant.

When the pressure in a discharge chamber becomes higher, the mean free path of electrons becomes shorter, so that electrons that have received energy from electromagnetic waves immediately collide with gas molecules and ionize or dissociate. Therefore, the plasma generation region will be localized in the vicinity of the central axis of the discharge chamber directly under a microwave introduction window, through which electromagnetic waves enter, and directly under a waveguide.

Further, as the pressure in the discharge chamber increases, the collision between charged particles and gas molecules increases, and isotropic diffusion becomes dominant. The charged particles disappear when colliding with the wall surface of the processing chamber, so that, when isotropic diffusion becomes dominant, the plasma density becomes higher at a place far from the wall surface, i.e., at the central part of the discharge chamber.

More specifically, an ion flux in a wafer surface has a convex distribution in which the ion flux is higher at a central part than at an outer peripheral portion, thus making it difficult to achieve uniformity. Although there are methods to improve such nonuniformity disclosed in the prior documents mentioned above, each has a problem.

According to the technique described in Patent Document 1, an electromagnetic wave shielding plate is installed on a plasma processing chamber side of the microwave introduction window. However, according to the prior technique, the electromagnetic wave shielding plate is located in the vicinity of high-density plasma, so that measures, such as ceramic thermal spray, are required to avoid metal contamination or the like caused by sputtering, leading to higher cost. Further, as shown in Patent Document 1, it is, in practical terms, extremely difficult to install an electromagnetic wave shielding plate under the microwave introduction window, but there is no specific description of a method for achieving this in Patent Document 1.

For example, as a method for fixing the electromagnetic wave shielding plate under the microwave introduction window, a method of fixing the electromagnetic wave shielding plate with an adhesive or a screw is conceivable. However, in the case of the fixing method using an adhesive, there is a high risk that the adhesive reacts due to radicals or ions in the processing chamber, generating a reaction product, which is incident on a substrate to be processed and causes the occurrence of an unintended failure. In addition, there is a risk of the adhesive peeling or the like due to the difference in thermal expansion between a dielectric and the electromagnetic wave shielding plate. On the other hand, in the fixing method using a screw, there is a risk that a minute foreign substance is generated when the screw and a screw hole are physically spirally slid during installation and removal.

Next, according to the technique described in Patent Document 2, in the plasma processing apparatus that does not use a magnetic field, microwaves are introduced through the annular ring slot. Such a prior technique is applied to a method that does not use a magnetic field, and no mention is made of a method that has a magnetic field. It has been found that, if the ring slot method is simply adopted for a magnetic field type plasma processing apparatus, then microwaves are diffracted in a slot part and wrap around the central part of the introduction window, and the microwaves are further selectively absorbed at the central part of the plasma processing chamber, thus localizing the plasma distribution at the central part. The conditions under which microwaves are less likely to wrap around the central part will be described later.

Further, according to the technique described in Patent Document 3, the second plasma having reached the cutoff density or more can be used like an electromagnetic wave shielding plate. However, it is considered that microwaves are inconveniently absorbed in the generation of the second plasma, which makes it difficult to efficiently generate the first plasma, thus requiring the supply of excessive power. In addition, there is a concern of a problem that the generation of the second plasma will, for example, inconveniently scrape a quartz window and that the area where the second plasma is generated will expand over time, causing the distribution of the second plasma density to change over time, and consequently causing the characteristics of the plasma processing to change over time.

An object of the present invention is to provide a plasma processing apparatus capable of achieving highly uniform plasma processing in a wide pressure range.

Means for Solving the Problems

To solve the problems described above, one of the typical plasma processing apparatuses according to the present invention is achieved by a plasma processing apparatus including: a processing chamber in which a sample is subjected to plasma processing, including, at an upper side therein, a dielectric plate through which a microwave is transmitted; a radio frequency power supply which supplies radio frequency power for the microwave; a cavity resonator which resonates a microwave transmitted from the radio frequency power supply through a waveguide and is placed above the dielectric plate; and a magnetic field forming mechanism which forms a magnetic field in the processing chamber, further including: a ring-shaped conductor placed inside the cavity resonator; and a circular conductor which is placed inside the cavity resonator and placed in an opening at a center of the ring-shaped conductor.

Advantageous Effect of the Invention

According to the present invention, it is possible to provide a plasma processing apparatus capable of achieving highly uniform plasma processing in a wide pressure range.

Problems, configurations, and advantageous effects other than those described above will be clarified from the following description of embodiments.

BRIEF DESCRIPTION OF THE DRAWINGS

FIGS. 2A-2D present enlarged sectional views of an area around a microwave introduction window.

FIGS. 3A-3D present enlarged sectional views of an area around the outer periphery of an outer conductive plate.

DESCRIPTION OF EMBODIMENT(S)

The embodiments of the present invention will be described below with reference to the drawings. In the present specification, the side where microwaves are supplied will be referred to as the upper side, and the side where a substrate stage/radio frequency electrode (sample stage) is located and to which microwaves are supplied will be referred to as the lower side.

First Embodiment

Figure 1:
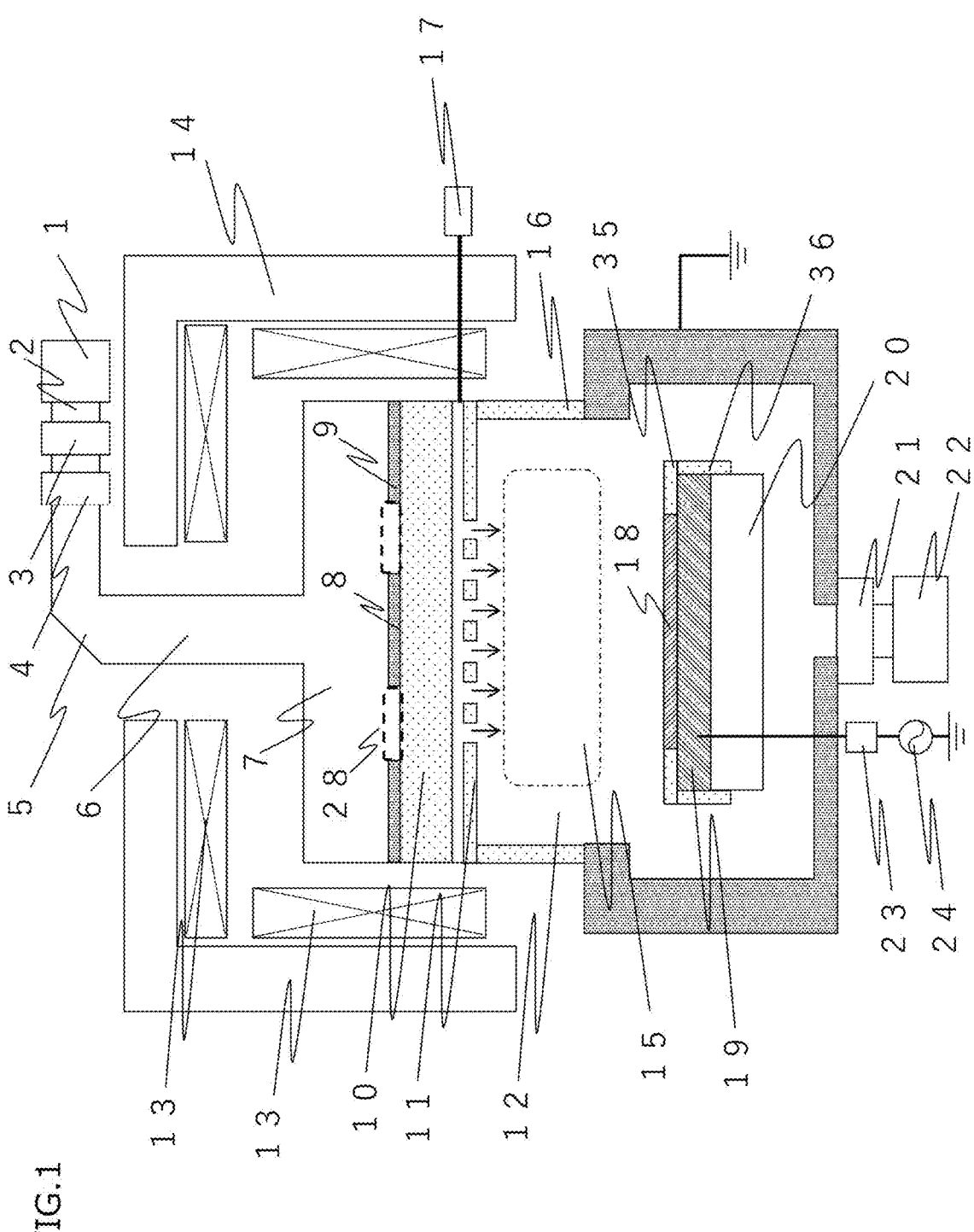
FIG. 1 is a sectional view of an etching apparatus according to a first embodiment of the present invention.

FIG. 1 is a sectional view of an etching apparatus as a plasma processing apparatus according to a first embodiment of the present invention. In the plasma processing apparatus, microwaves are oscillated from a microwave source 1 and transmitted to a circular waveguide 6 through a rectangular waveguide 2, an isolator 3, an automatic matching unit 4, and a circular/rectangular converter 5. In the present embodiment, 2.45 GHz microwaves, which are frequently used industrially, are used.

The isolator 3 is used to protect the microwave source (also referred to as a radio frequency power supply) 1 from the reflected waves of microwaves, and the automatic matching unit 4 is used to adjust load impedance and suppress reflected waves so as to efficiently supply microwaves. Microwaves introduced from the circular waveguide 6 are propagated into a cavity unit (also referred to as a cavity resonator) 7, passed through a microwave introduction window 10 and a shower plate 11 from a ring-shaped slot (also simply referred to as a slot) 28 having the same width as that between an inner conductive plate (also referred to as a circular conductor) 8 and an outer conductive plate (also referred to as a ring-shaped conductor) 9, which are coaxially installed in the cavity unit 7, and supplied to a plasma processing chamber 12. The microwave introduction window 10 constitutes a dielectric plate, and the shower plate 11 constitutes a gas supply plate.

The cavity unit 7 is formed using a conductor as a material that reflects microwaves. Aluminum, for example, is suitably used as a material for the cavity unit 7. The inner conductive plate 8 is placed in the opening at the center of the outer conductive plate 9, each having an axisymmetric shape to achieve axisymmetric microwave propagation. The inner conductive plate 8 and the outer conductive plate 9 constitute a dielectric plate placed at the top of the processing chamber.

In the present embodiment, the inner conductive plate 8 is a circular plate, and the outer conductive plate 9 is a ring-shaped circular plate. The material of the inner conductive plate 8 and the outer conductive plate 9 may be any conductive material, but is desirably a non-magnetic material so as not to be affected by a coil magnetic field applied in the apparatus. In the present embodiment, aluminum is used as the material of the inner conductive plate 8 and the outer conductive plate 9.

Electromagnetic coils (also referred to as magnetic field forming mechanisms) 13 are disposed around the plasma processing chamber 12, and a yoke 14 is disposed around the outer peripheries of the electromagnetic coils 13. By supplying a predetermined current to the electromagnetic coils 13, a static magnetic field distribution adjusted to satisfy a magnetic flux density required for ECR is formed in the plasma processing chamber 12. The yoke 14 has a role of a magnetic shield that prevents the leakage of the magnetic field to the outside of the apparatus.

The magnetic field lines formed by the electromagnetic coils 13 and the yoke 14 become a diffuse magnetic field that spreads in the outer peripheral direction from the top to the bottom of the plasma processing chamber 12. In the case of microwaves of 2.45 GHz, the magnetic flux density required for ECR is 875 G. The static magnetic field distribution is adjusted to form an isomagnetic field surface (ECR surface) of 875 G so as to enter into the plasma processing chamber 12, thereby efficiently generating plasma 15.

In order to protect the side wall of the plasma processing chamber 12 from plasma, an inner cylinder 16 is installed on the inner side of the side wall of the plasma processing chamber 12. The inner cylinder 16, which is located in the vicinity of the plasma 15, is formed of quartz as a material having high plasma resistance. Alternatively, the inner cylinder 16 may be formed using other materials having high plasma resistance, such as yttria, alumina, yttrium fluoride, aluminum fluoride, aluminum nitride or the like.

The microwave introduction window 10 and the shower plate 11 are formed using quartz as a material that transmits microwaves. Alternatively, other dielectric materials can be used to form the microwave introduction window 10 and the shower plate 11, as long as the materials transmit microwaves, and as a material having high plasma resistance, yttria, alumina, yttrium fluoride, aluminum fluoride, aluminum nitride or the like may be used to form the microwave introduction window 10 and the shower plate 11.

A gas is supplied between the microwave introduction window 10 and the shower plate 11 from a gas supply unit 17. The gas supply unit 17 includes a function for supplying a desired flow rate by a mass flow controller. Further, the type of gas used for plasma processing is appropriately selected according to a film to be processed or the like, and a plurality of types of gases are combined and supplied at a predetermined flow rate.

A plurality of gas supply holes are provided at the central part of the shower plate 11, and a gas supplied from the gas supply unit 17 is supplied to the plasma processing chamber 12 through the gas supply holes. The gas supplied to the plasma processing chamber 12 is vacuum-exhausted by a turbo molecular pump 22 through a conductance adjustment valve 21.

A substrate stage/radio frequency electrode 19, on which a substrate to be processed (also referred to as a sample) 18 is placed, is provided under the plasma processing chamber 12, and further, an insulating plate 20 is provided under the substrate stage/radio frequency electrode 19. A bias power supply 24 is connected to the substrate stage/radio frequency electrode 19 through an automatic matching unit 23 to supply bias power. In the present embodiment, the frequency of the bias power supply 24 was set to 400 kHz.

The substrate stage/radio frequency electrode 19 is provided with a suction mechanism for the substrate to be processed 18 and a temperature control unit, which are not illustrated, and the temperature of the substrate to be processed 18 is adjusted as necessary to perform desired etching on the substrate to be processed 18. A susceptor 35 and a stage cover 36 are installed to protect the outer peripheral portion of the substrate stage radio frequency electrode 19 from the plasma 15. Quartz is used for the susceptor 35 and the stage cover 36 as a material having high plasma resistance.

Etching is performed by turning a gas introduced into the plasma processing chamber 12 into plasma by a magnetic field formed by the electromagnetic coils 13 and microwaves supplied from the microwave source 1, and by irradiating the ions and radicals generated there onto the substrate to be processed 18.

If the center position of the inner conductive plate 8 deviates from the central axis of the apparatus, the axisymmetric supply of microwaves becomes difficult, thus affecting the uniformity of plasma processing. Therefore, it is important to adopt countermeasures for suppressing the deviation of the center position of the inner conductive plate 8 from the central axis as necessary.

A specific installation example of the inner conductive plate 8 will be described with reference to FIGS. 2A-2D. FIGS. 2A-2D are enlarged sectional views of an area around the microwave introduction window 10. In the example shown in FIG. 2A, the inner conductive plate 8 is installed in a central portion of the top of the microwave introduction window 10, and the outer conductive plate 9 is installed in the outer peripheral portion thereof. In the example of FIG. 2A, the inner conductive plate 8 is not fixed to the microwave introduction window 10, thus leading to a risk that the center position of the inner conductive plate 8 deviates from the central axis of the plasma processing chamber 12 when the inner conductive plate 8 is installed.

Further, during plasma processing, the plasma processing chamber 12 is heated by the heat input from plasma, and the heat is transferred to the surrounding area, causing the microwave introduction window 10, the inner conductive plate 8, and the outer conductive plate 9 to become hot in some cases. Therefore, as a result of repeated temperature raising and cooling in the course of plasma processing, the inner conductive plate 8 repeats thermal expansion and thermal contraction, and the installation position slightly deviates, thus leading to a risk that the deviation is accumulated.

Meanwhile, a configuration for suppressing the deviation of the center position of the inner conductive plate 8 is illustrated in FIG. 2B. In the configuration illustrated in FIG. 2B, a spacer 25 is installed between the inner conductive plate 8 and the outer conductive plate 9. In this configuration, the presence of the spacer 25 suppresses the positional deviation of the inner conductive plate 8. The spacer 25 is formed using, for example, quartz as a material that propagates microwaves.

The linear expansion coefficient of aluminum used as the inner conductive plate 8 and the outer conductive plate 9 is $23.6 \times 10^{-6}$ [1/° C.], and the linear expansion coefficient of quartz used as the microwave introduction window 10 and the spacer 25 is $0.52 \times 10^{-6}$ [1/° C.], indicating a relatively large difference in thermal expansion between these members. Consequently, if there is no play (gap) between the side surface of the inner conductive plate 8 and the side surface of the spacer 25, then the spacer 25 is pressed against the inner conductive plate 8 due to the difference in thermal expansion between the inner conductive plate 8 and the spacer 25, thus generating a stress. Quartz is a brittle material, so that there is a risk of cracking and breaking if a force is applied to the spacer 25.

However, if a play is provided between the two in consideration of the difference in thermal expansion, then the installation position may be shifted by the amount of the play when the inner conductive plate 8 is installed, and highly accurate positioning may not be possible. Therefore, for example, the spacer 25 can be used to adjust the position of the inner conductive plate 8, and the spacer 25 can be removed to return to the configuration illustrated in FIG. 2A when plasma processing is performed.

Alternatively, a temperature control device of some kind can be used to adjust the temperatures of the inner conductive plate 8, the spacer 25, the outer conductive plate 9, and the microwave introduction window 10 to suppress thermal expansion in exchange for eliminating the above play. As the temperature control device, for example, a blowing device for blowing temperature-controlled air onto the inner conductive plate 8, the outer conductive plate 9, and the microwave introduction window 10 is used.

As another measure for suppressing the positional deviation of the inner conductive plate 8, it is conceivable to fix the inner conductive plate 8. For example, the inner conductive plate 8 and the microwave introduction window 10 may be bonded to each other by using an adhesive. In such a case, in order to prevent the inner conductive plate 8 from peeling off from the microwave introduction window 10, it is desirable to impart, to the adhesive, a property as a buffer layer that absorbs the difference in thermal expansion between the inner conductive plate 8 and the microwave introduction window 10.

In addition, the inner conductive plate 8 may alternatively be formed by coating the surface of the microwave introduction window 10 with a conductor film by sputtering, chemical vapor deposition, plating, or the like. In such a case, as with the case of bonding, there is a risk of the film peeling due to the difference in thermal expansion between the inner conductive plate 8 and the microwave introduction window 10, and therefore, it is desirable to form a buffer layer, as necessary, between the inner conductive plate 8 and the microwave introduction window 10.

Alternatively, if the inner conductive plate 8, the spacer 25, the outer conductive plate 9, and the microwave introduction window 10 are temperature-controlled by a temperature control device or the like to suppress thermal expansion, then the buffer layer mentioned above is unnecessary. Further, if a thin film is formed as the inner conductive plate 8, it is desirable to set the thickness to be equal to or larger than the skin depth so as not to transmit microwaves. For example, if copper is used as the conductor film, the skin depth for microwaves of 2.45 GHz is 4.2 μm, so that it is desirable to form a conductor film having a thickness of at least 4.2 μm or more.

Another configuration for suppressing the positional deviation of the inner conductive plate 8 is illustrated in FIG. 2C, In the configuration illustrated in FIG. 2C, a stepped portion is formed at the central part of the microwave introduction window 10, and the inner conductive plate 8 is fitted in the stepped portion. In order to reduce the risk of damage to the stepped portion, it is desirable to provide a slight play between the diameter of the stepped portion of the microwave introduction window 10 and the diameter of the inner conductive plate 8 in consideration of the difference in thermal expansion between the two. However, as described above, if a play is provided, then there is a risk of positional deviation accordingly when the inner conductive plate 8 is installed. On the other hand, if the thermal expansion can be suppressed by a temperature control device or the like, then it is not necessary to provide the play.

Next, a preferred configuration for reducing the risk of damage to the stepped portion caused by the difference in thermal expansion between the microwave introduction window 10 and the inner conductive plate 8 and for suppressing the positional deviation is illustrated in FIG. 2D. In the configuration illustrated in FIG. 2D, a stepped portion is provided at the center of the microwave introduction window 10, and the outer peripheral surface of the stepped portion has a concave tapered shape, the diameter of which decreases toward the microwave introduction window 10. Further, the outer peripheral portion of the inner conductive plate 8 has a surface having a convex tapered shape corresponding to the concave tapered shape of the stepped portion.

Since the stepped portion has the surface having the concave tapered shape, when the inner conductive plate 8 expands outward in the radial direction due to thermal expansion, the inner conductive plate 8 escapes (shifts) upward along the tapered shape, thus making it possible to prevent excessive stress from being generated in the member and therefore to reduce the risk of damage to the member. In addition, the surface of the stepped portion, which has the concave tapered shape, of the microwave introduction window 10 is always in contact with the surface of the outer peripheral portion, which has the convex tapered shape, of the inner conductive plate 8, so that the positional deviation of the inner conductive plate 8 from the central axis is suppressed. In addition, the inner conductive plate 8 can be removed by simply lifting it upward, providing an advantage of being easy to attach and detach at the time of maintenance.

A description will now be given of a specific installation example of the outer conductive plate 9. The deviation of the center of the outer conductive plate 9 from the central axis of the apparatus also affects the uniformity of plasma processing, so that it is important to adopt countermeasures to suppress the deviation of the outer conductive plate 9 from the central axis. However, unlike the case of the inner conductive plate 8, the risk of the positional deviation of the outer conductive plate 9 and the risk of damage due to the difference in thermal expansion are relatively low.

For example, if the outer peripheral portion of the cavity unit 7 and the outer conductive plate 9 are made of the same material, then there is no need to consider the difference in thermal expansion, so that it is not necessary to provide play between the outer peripheral portion of the cavity unit 7 and the outer conductive plate 9. Further, even if the cavity unit 7 and the outer conductive plate 9 are made of different metal materials having different linear expansion coefficients, both members, unlike quartz, are not brittle materials, so that even if stress is generated between the members due to the difference in thermal expansion, the risk of damage is small. Therefore, bringing the outer peripheral portion of the cavity unit 7 and the outer peripheral portion of the outer conductive plate 9 into close contact with each other reduces the risk of the positional deviation.

The following will describe a specific installation example of the outer conductive plate 9 with reference to FIGS. 3A-3D. FIGS. 3A-3D are enlarged sectional views of an area around the outer peripheral portion of the outer conductive plate 9, the left side representing the direction toward the outer periphery, and the right side representing the direction toward the center. In the example of FIG. 3A, the outer conductive plate 9 is installed on the microwave introduction window 10 and is not fixed to either the cavity unit 7 or the microwave introduction window 10. In such a case, the outer conductive plate 9 has freedom of movement in a height direction and a rotational direction.

Next, in the example of FIG. 3B, pins 26 are embedded in the inner periphery of the cavity unit 7 and protrude in the radial direction, and the outer conductive plate 9 is installed in such a manner that the pins 26 are engaged with pin grooves of the outer conductive plate 9. A plurality (preferably three or more) of the pins 26 are installed in the peripheral direction, for example, at equal intervals. At this time, the pins 26 are constrained by the walls of the pin grooves in the peripheral direction, so that the movement of the outer conductive plate 9 in the rotational direction is restricted.

According to the configurations of FIGS. 3A and 3B, the outer conductive plate 9 can be removed by lifting it upward, thus providing an advantage of being easy to attach and detach at the time of maintenance.

The example of FIG. 3C has a configuration in which holes for inserting screws 27 are formed through the peripheral wall of the cavity unit 7, screw holes are formed in the side surface of the outer conductive plate 9, and the screws 27 inserted through the holes of the cavity unit 7 are screwed into the screw holes, thereby fixing the outer conductive plate 9. A plurality (preferably three or more) of the screws 27 are installed in the peripheral direction, for example, at equal intervals. According to the configuration of FIG. 30, the outer conductive plate 9 is fixed in both the height direction and the peripheral direction.

In the example of FIG. 30, the cavity unit 7 and the outer conductive plate 9 are structured to be integral. In such a configuration, it is necessary to fabricate the cavity unit 7 and the outer conductive plate 9 by welding, casting, machining, or the like, so that the manufacturing cost is high, but there will be no deviation of the outer conductive plate 9 with respect to the cavity unit 7.

If the material of the pins 26 and the screws 27 is a conductor, the cavity unit 7 and the outer conductive plate 9 are electrically conductive and therefore have the same potential in the configurations illustrated in FIGS. 3B, 3C, and 3D. Consequently, grounding the cavity unit 7, for example, makes it possible to prevent the outer conductive plate 9 from being charged.

Further, in the configurations illustrated in FIGS. 3A and 3B, the lower surface of the outer conductive plate 9 and the upper surface of the microwave introduction window 10 can be brought into close contact with each other. On the other hand, in the configurations illustrated in FIGS. 30 and 3D, a slight gap is preferably provided between the upper surface of the microwave introduction window 10 and the lower surface of the outer conductive plate 9 in consideration of dimensional tolerances. In such a case, unless the dimensional tolerances are strictly controlled, there is a risk of damage to the microwave introduction window 10 if the microwave introduction window 10 is accidentally pushed downward by the outer conductive plate 9.

In consideration of the need for the antistatic protection and the ease of maintenance of the outer conductive plate 9, any of the specific installation examples of the outer conductive plate 9 described in FIGS. 3A-3D may be adopted. Further, although the description has been given with reference to FIGS. 3A-3D as typical installation examples of the outer conductive plate 9, different installation examples may be adopted as long as the above-mentioned concepts such as the positional deviation and damage risk are taken into consideration.

As described above, in the case where the pressure in the plasma processing chamber 12 is high, microwaves incident in the vicinity of the central axis of the plasma processing chamber 12 cause plasma generation to be localized at the center. In order to suppress the localization of plasma generation in the vicinity of the central axis, it is desirable to suppress the propagation of the microwaves heading toward the vicinity of the central axis of the plasma processing chamber 12. In other words, it is desirable that the microwave propagating through the circular waveguide 6 enters the plasma processing chamber 12 outward in the radial direction.

Figure 4:
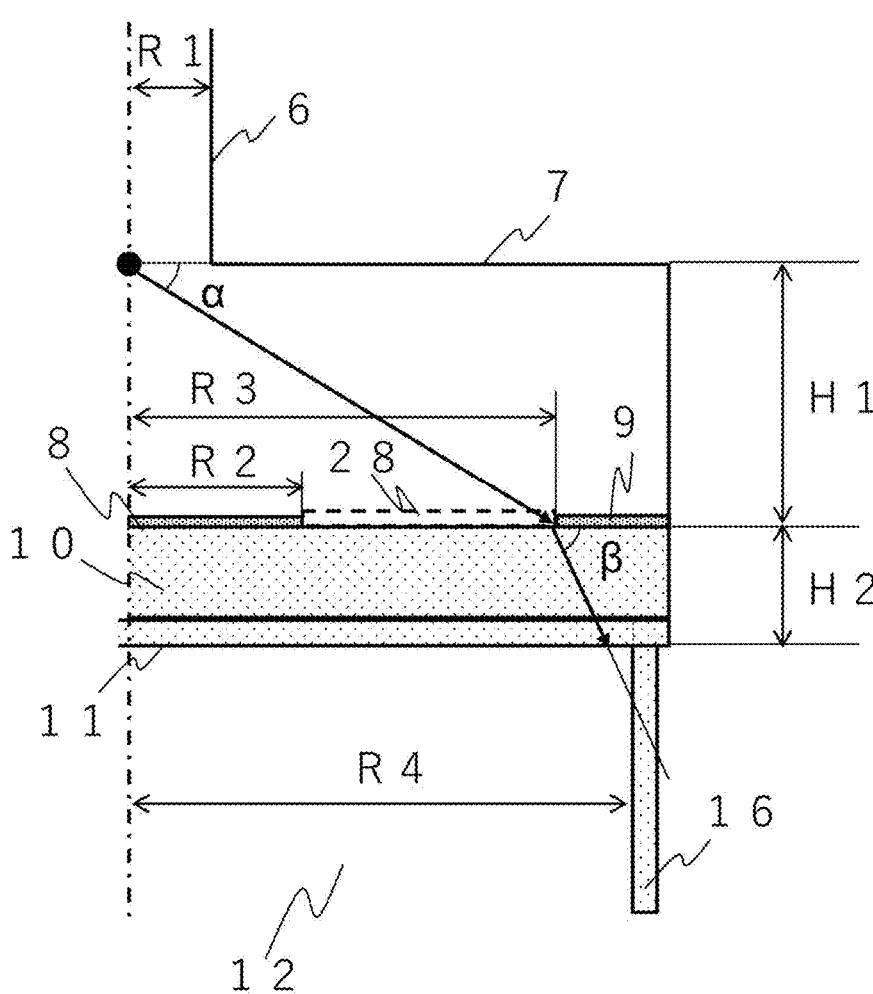
FIG. 4 is an enlarged sectional view of an area around a cavity unit.

FIG. 4 is an enlarged schematic sectional view of an area around the cavity unit 7 of the present embodiment. The inner conductive plate 8 has a function for suppressing the direct propagation of microwaves from the circular waveguide 6 onto the central axis of the plasma processing chamber 12. In order to suppress the direct incidence to the center of the plasma processing chamber 12 from the circular waveguide 6, a radius R2 of the inner conductive plate 8 is desirably set to be larger than a radius R1 of the circular waveguide 6.

For example, if the radius R1 of the waveguide 6 is set to 45 mm as the radius at which 2.45 GHz TE11 mode microwaves are ideally propagated, then it is preferable that R2>45 mm. Further, the outer conductive plate 9 has a function as a guide for causing microwaves to enter the plasma processing chamber 12 outward in the radial direction.

The present inventors have studied the conditions of a radius R3 of the outer conductive plate 9 that are preferable to impart the function as a guide. For detailed study, it is necessary to consider the inner wall of the cavity unit 7 and the reflected waves from the plasma 15, but for the sake of simplicity in this study, it was examined whether the microwaves entering the microwave introduction window 10 directly from the circular waveguide 6 propagates with radially outward components when entering the plasma processing chamber 12.

The present inventors have found that the condition for efficient propagation of microwaves outward in the radial direction to the plasma processing chamber 12 is that microwaves passing the outer periphery side of the slot 28 enter the plasma processing chamber 12 without being reflected by the side walls of the microwave introduction window 10 and the shower plate 11, The microwaves heading from the circular waveguide 6 to the outer peripheral portion of the slot 28 at an angle $\alpha$ are refracted by the microwave introduction window 10 in the direction of an angle $\beta$. Then, the microwaves pass through the shower plate 11 and are introduced into the plasma processing chamber 12. At this time, the condition under which microwaves passing the outer periphery of the slot 28 are introduced into the plasma processing chamber 12 with the radially outward components is represented by mathematical expression (1) given below.

12

[Math. 1]

$$H_2 \leq (R_4 - R_3)\tan\beta \qquad (1)$$

where R4 denotes the radius of the plasma processing chamber 12 (the radius of the inner cylinder 16), and H2 denotes the sum of the thicknesses of the microwave introduction window 10 and the shower plate 11. There is a thin layer that serves as a gas flow path between the microwave introduction window 10 and the shower plate 11, but the thin layer was ignored because the thickness thereof is sufficiently thinner than the microwave introduction window 10 or the shower plate 11. Further, mathematical expression (2) given below is obtained from the geometrical relationship of FIG. 4.

[Math. 2]

$$\tan\alpha = \frac{H_1}{R_3} \qquad (2)$$

Further, using Snell's law, the relational expression of $\alpha$, $\beta$ and a relative permittivity $\varepsilon r$ of the microwave introduction window 10 and the shower plate 11 is obtained by mathematical expression (3) given below.

[Math. 3]

$$\frac{\cos\alpha}{\cos\beta} = \sqrt{\epsilon_r} \qquad (3)$$

Here, the same material, quartz, was used for the microwave introduction window 10 and the shower plate 11. When mathematical formulas (1) to (3) are organized, mathematical expression (4) given below is obtained as a condition to be satisfied by R3.

[Math. 4]

$$R_3 \leq R_4 - \frac{H_2}{\sqrt{\epsilon_r\left(1 + \left(\frac{H_1}{R_2}\right)^2\right) - 1}} \qquad (4)$$

For example, if R2 is 100 mm, H2 is 50 mm, R4 is 250 mm, and $\varepsilon r$ is 3.8, then R3 has to be 230.5 mm or less according to mathematical expression (4).

If the difference between the inner radius R3 of the outer conductive plate 9 and the radius R2 of the inner conductive plate 8 (slot width W) is small, then the microwaves passing through the slot 28 inconveniently diffract toward the central axis of the plasma processing chamber 12. In other words, in order for the microwaves to be introduced into the plasma processing chamber 12 with the radially outward components without being diffracted, there is an appropriate condition for the slot width W. The slot width \N for suppressing the diffraction will be described below.

Figure 5:
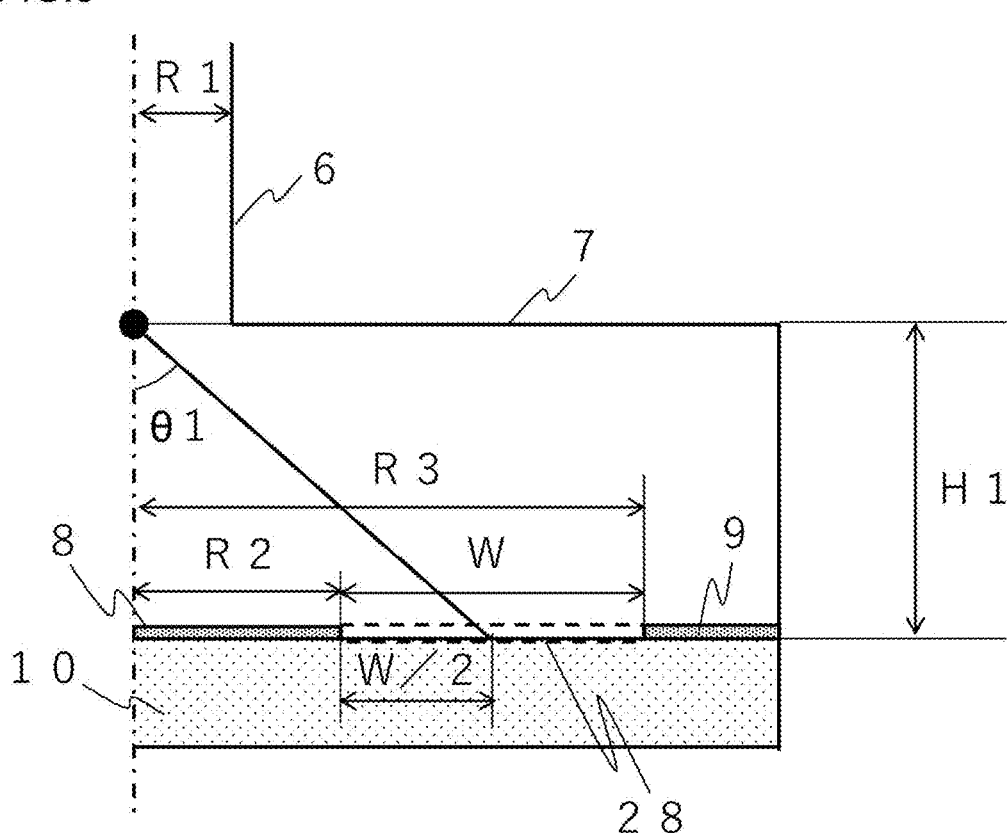
FIG. 5 is an enlarged sectional view of the area around the cavity unit.

FIG. 5 is an enlarged schematic sectional view of the area around the cavity unit 7 of the present embodiment. Further, if an angle formed by the line from the lower end of the circular waveguide 6 and the central axis to the center of the slot 28 is denoted by $\theta 1$, then $\theta 1$ is expressed by mathematical expression (5) given below.

[Math. 5]

$$\theta_1 = \sin^{-1}\frac{R_2 + \dfrac{W}{2}}{\sqrt{\left(R_2 + \dfrac{W}{2}\right)^2 + H_1^2}} \tag{5}$$

Figure 6:
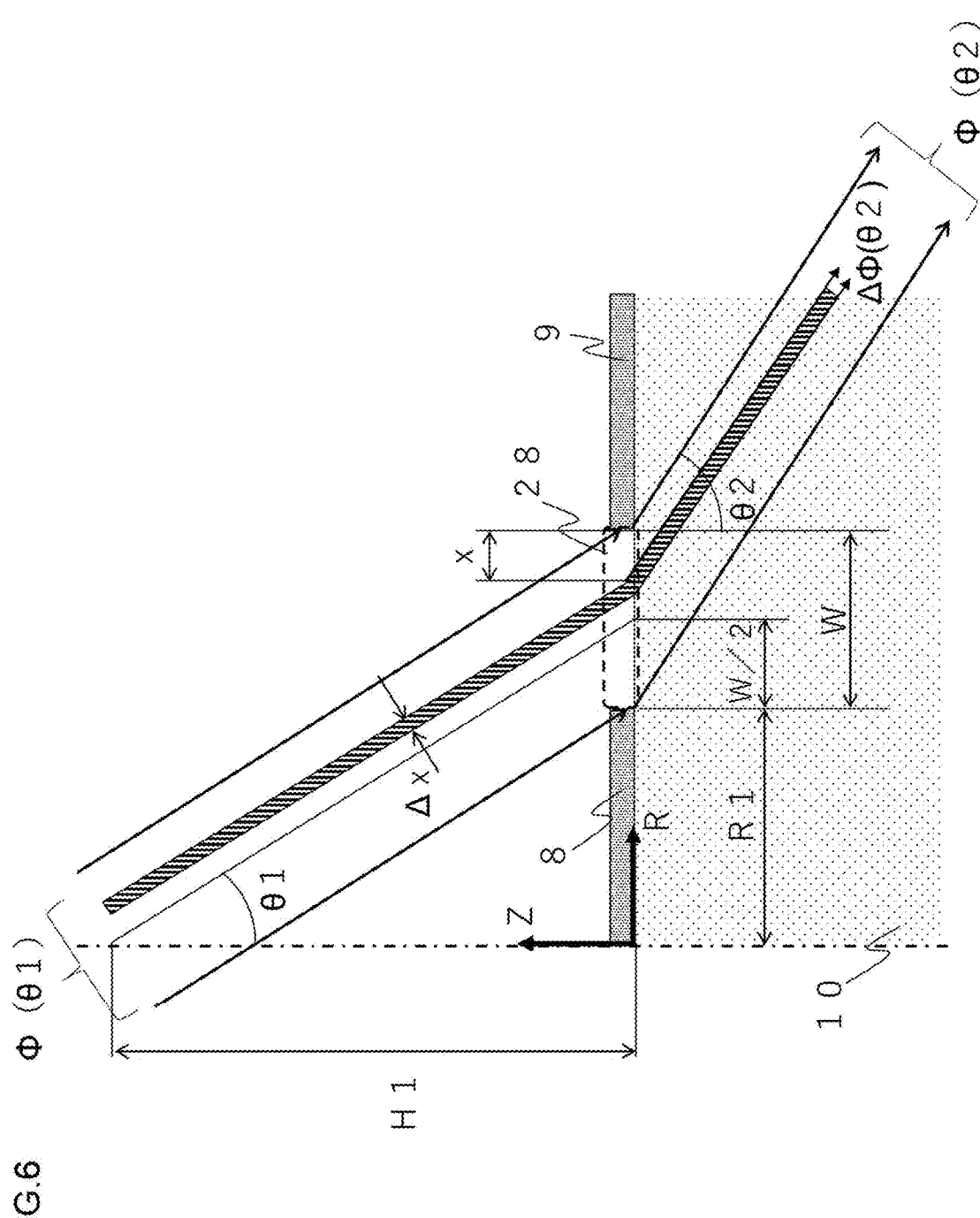
FIG. 6 is an enlarged sectional view of the area around the cavity unit of the present invention.

In order to estimate the conditions under which diffraction is less likely to occur, the case where a plane wave is incident in a single slit from the direction of θ1 was considered. FIG. 6 is an enlarged sectional view of the area around the microwave introduction window 10. A microwave Φ (θ1) heading toward the slot 28 at the angle θ1 with an amplitude A (θ1) from R=0 and a height position of Z=H1 is expressed by mathematical expression (6) given below.

[Math. 6]

$$\Phi(\theta_1)=A(\theta1)\sin 2\pi ft \tag{6}$$

where f denotes the frequency of a microwave and t denotes time. If Φ (θ1) is considered to be the amplitude of a composite wave of the wave per slot unit width, then the amplitude of the microwave per slot unit width is A (θ1)/W. If microwaves passing through a minute width Δx at a distance x from the right end of the drawing in the slot 28 are diffracted in the direction of θ2 at the slot 28, then the optical path difference from the microwaves passing the right end of the drawing in the slot 28 and diffracting is expressed by mathematical expression (7) given below.

[Math. 7]

$$\frac{x\left(\sqrt{\epsilon_r}\ \sin\theta_2 - \sin\theta_1\right)}{\lambda} \tag{7}$$

where λ denotes the wavelength of a microwave. Therefore, a microwave ΔΦ(θ2) passing through the minute width Δx is expressed by mathematical expression (8) given below, taking the optical path difference of mathematical expression (7) into account.

[Math. 8]

$$\Delta\Phi(\theta_2) = \frac{A(\theta_1)}{W}\sin 2\pi\left(ft - \frac{x\left(\sqrt{\epsilon_r}\ \sin\theta_2 - \sin\theta_1\right)}{\lambda}\right)\times\Delta x \tag{8}$$

By integrating ΔΦ (θ2) over the entire slit width, the microwave Φ (θ2) diffracted in the direction of θ2 from the slot 28 is determined by mathematical expression (9) given below,

[Math. 9]

$$\begin{aligned}\Phi(\theta_2) &= \int_0^W d\phi(\theta_2)\\ &= \int_0^W \frac{A(\theta_1)}{W}\sin 2\pi\left(ft - \frac{x\left(\sqrt{\epsilon_r}\ \sin\theta_2 - \sin\theta_1\right)}{\lambda}\right)\\ &= A(\theta_1)\frac{\sin\left(\dfrac{\pi CW}{\lambda}\right)}{\dfrac{\pi CW}{\lambda}}\cdot\sin\left(2\pi\left(ft - \frac{WC}{2\lambda}\right)\right)\end{aligned} \tag{9}$$

where C can be expressed by mathematical expression (10) given below.

[Math. 10]

$$C\equiv\sqrt{\epsilon_r}\ \sin(\theta_2)-\sin\theta_1 \tag{10}$$

Using the fact that the intensity of an electromagnetic wave is proportional to the square of a wave amplitude, intensity I (θ2) of the electromagnetic wave diffracted in the direction of θ2 is expressed by mathematical expression (11) given below from mathematical expression (6) and mathematical expression (9) by using intensity I (θ1) of an electromagnetic wave incident from the direction of θ1.

[Math. 11]

$$I(\theta_2) = \left(\frac{\sin\left(\dfrac{\pi CW}{\lambda}\right)}{\dfrac{\pi CW}{\lambda}}\right)^2 I(\theta_1) \tag{11}$$

Here, an index INDEX at which the microwave wraps around the central axis side of the plasma processing chamber 12 due to the diffraction in the slot 28 is defined by mathematical expression (12) given below.

[Math. 12]

$$INDEX \equiv \frac{\displaystyle\int_0^{-\frac{\pi}{2}} I(\theta_2)d\theta_2}{\displaystyle\int_{-\frac{\pi}{2}}^{\frac{\pi}{2}} I(\theta_2)d\theta_2} \tag{12}$$

The index denotes the ratio of the intensity of an electromagnetic wave diffracted toward the center side of the plasma processing chamber 12 with respect to the intensity of an electromagnetic wave incident from the slot 28 to the plasma processing chamber 12. In other words, the smaller the value of INDEX is, the better it suppresses the diffraction of microwaves to the central axis side of the plasma processing chamber 12.

Here, if the height of a cavity resonance unit is denoted by HA, the thickness of the microwave introduction window 10 and the shower plate 11 is denoted by HB, the relative permittivity of the microwave introduction window 10 and the shower plate 11 is denoted by εr, and the radius of the plasma processing chamber 12 is denoted by RB, then a radius RC of the outer conductive plate 9 satisfies:

$$RC\leq RB-HB/(\epsilon r(1+(HA/RB)^2)-1)^{(1/2)}$$

Figure 7:
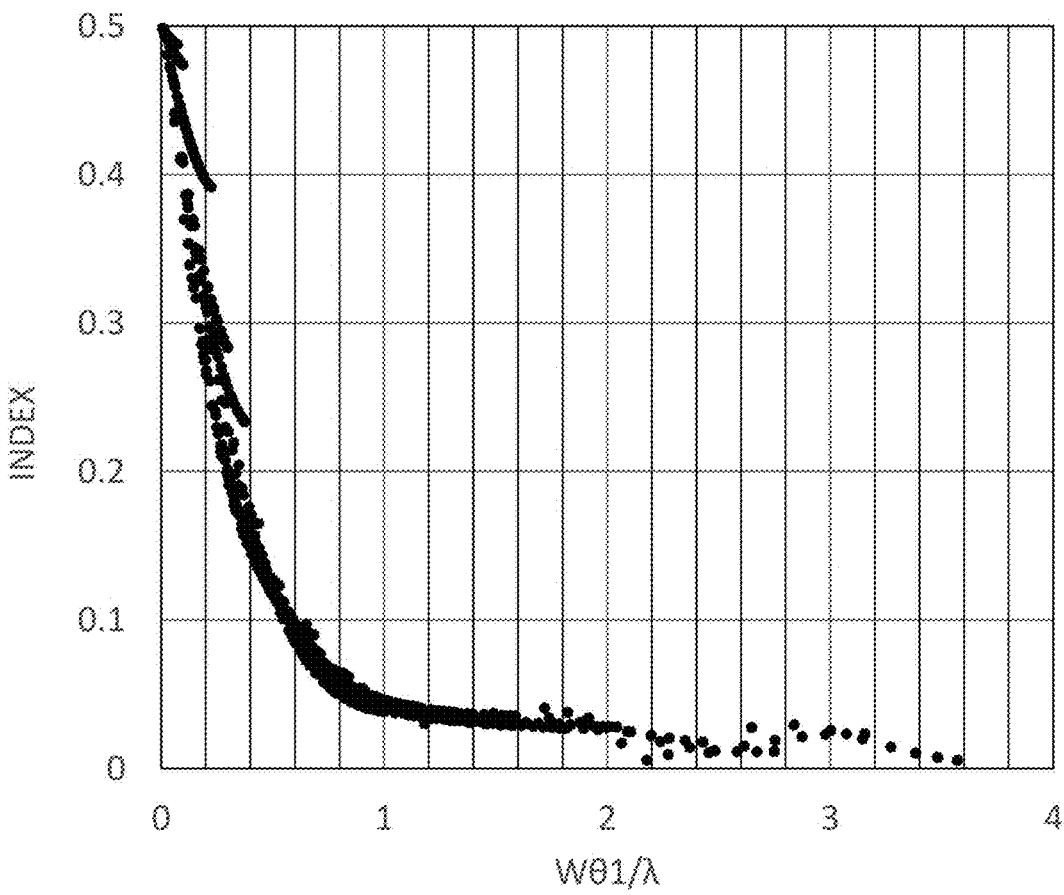
FIG. 7 is a scatter plot illustrating the relationship between an index, at which microwaves wrap around toward a center, and $W\theta 1/\lambda$.

The results of the calculations of INDEX are shown in FIG. 7. INDEX refers to the ratio of an inward microwave component to a total microwave component. The INDEX calculation was carried out within the range of 20 to 200 mm for R2, 50 to 200 mm for H1, 10 to 190 mm for W, and 60 to 180 mm for λ. INDEX is generally expressed as a function of Wθ1/λ, and becomes smaller when Wθ1/A becomes larger. This means that when the slot width W is large, when the microwave introduction angle θ1 is large, or when the wavelength of a microwave is small, it becomes difficult for the microwave to wrap around to the center side of the plasma processing chamber 12.

For example, the reference of INDEX is set to 0.1. This reference is 80% lower than a maximum value 0.5 of INDEX, and the effect for suppressing diffraction can be fully expected. When $W\theta1/\lambda$ at which INDEX becomes 0.1 or less is read from FIG. 7, $W\theta1/\lambda$ is approximately within the range of mathematical expression (13) given below, and various dimensions can be determined such that mathematical expression (13) is satisfied.

[Math. 13]

$$\frac{W\theta_1}{\lambda} \ge 0.5 \tag{13}$$

Then, the present inventors calculated, according to mathematical expression (5) and mathematical expression (13), the relationship of the minimum values of W when the horizontal axis indicates R2. The calculation was carried out by changing the height H1 of the cavity unit 7, and the calculation results are shown in FIG. 8.

As R2 increases, the minimum value of W asymptotically approaches a fixed value. This is because, from mathematical expression (5), $\theta1$ asymptotically approaches $\pi/2$ when R2 is large. Considering $\theta1<\pi/2$, it is desirable that W in mathematical expression (13) satisfies at least $W \ge \lambda/\pi$. In other words, a value W obtained by subtracting the radius of the inner conductive plate 8 from the radius of the inner periphery of the outer conductive plate 9 is preferably a value equal to or more than a value obtained by dividing the wavelength $\lambda$ of the microwave by pi $\pi$. For example, when $\lambda$ is 120 mm, W is at least 38 mm or more. From FIG. 8, as R2 becomes smaller, the minimum value of W becomes larger.

Figure 8:
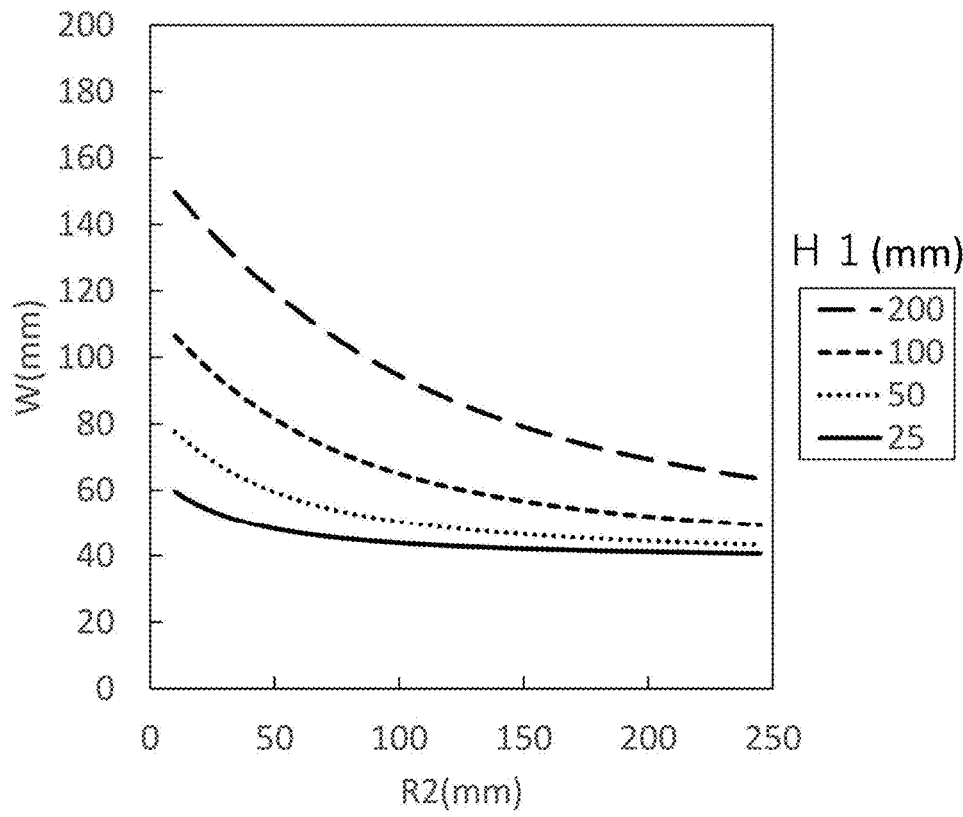
FIG. 8 is a diagram illustrating the calculation results of the relationship between an inner waveguide radius R2 and a minimum W required at that time.

For example, when the minimum W is read from FIG. 8 when R2 is 100 mm and H1 is 100 mm, the minimum value of W is 65 mm. Further, from mathematical expression (4), $R3 \le 230.5$ mm and $W \le 130.5$ mm. Summarizing the above indicates that W should be selected in the range of 65 mm $\le W \le 130.5$ mm. In other words, the width of the slot of the present embodiment has a dimension defined on the basis of the wavelength of a microwave, and the width is preferably equal to or larger than a dimension capable of suppressing the diffraction of the microwave.

Here, as an example of the embodiment, the range of W has been determined, with R2 fixed to 100 mm; however, the order of determining the dimensions is not limited to this, and the dimensions may be appropriately determined. Further, in the present embodiment, although the reference of INDEX for suppressing diffraction has been set to 0.1, each dimension may alternatively be determined using a smaller value as the reference, as necessary.

Figure 9:
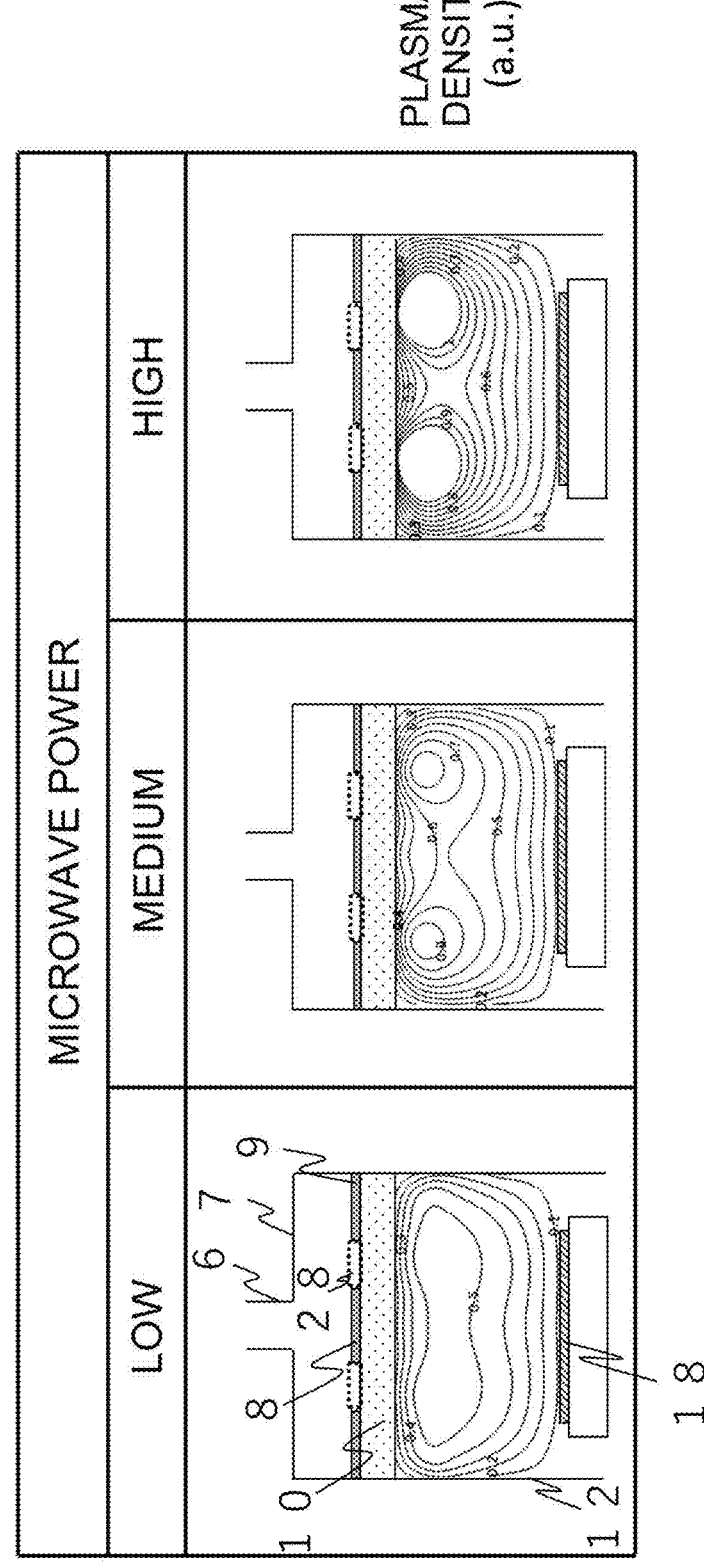
FIG. 9 is a diagram illustrating the calculation results of plasma density distribution when microwaves are changed in the etching apparatus according to the first embodiment of the present invention.

FIG. 9 illustrates the results of the calculations of the plasma density distribution inside the plasma processing chamber 12 when microwaves are changed. The dimensions were set such that R1 was 45 mm, R2 was 60 mm, W was 100 mm, and H1 was 85 mm. The $W\theta1/\lambda$ at this time is 0.76, and INDEX corresponding thereto read from FIG. 7 is 0.1 or less, and it is expected that the diffraction of microwaves can be suppressed.

The plasma densities were estimated by coupled calculation of a microwave electromagnetic field model and a drift-diffusion model. Although a plurality of types of gases are used in actual plasma processing, only the case of Ar gas was considered for the sake of simplicity. As the pressure, a high pressure condition of 4 Pa was used.

As illustrated in FIG. 9, in the case of low microwaves, there is a region having a high plasma density in the central part of the plasma processing chamber 12. It is seen that the microwaves then diffuse as they head toward the wafer under the contour diagram given in FIG. 9, and become uniform in the radial direction. Further, as the microwave power is increased, the plasma density spreads outward in the radial direction, resulting in a ring-shaped plasma distribution. This result indicates that, according to this configuration, the microwaves that pass through the slot 28 do not wrap around the central part of the plasma processing chamber 12, and efficiently propagate outward in the radial direction to generate plasma. This is considered due to the fact that the inner conductive plate 8 can suppress the microwaves heading directly from the circular waveguide 6 to the central part side, and the outer conductive plate 9 can suppress microwaves reflected by the inner wall of the processing chamber from heading to the central part side. In addition, the radial distribution of the plasma changes depending on the microwave power, which indicates that the microwave power functions as a control knob for adjusting the radial distribution of the plasma and thus the radial distribution of an etching rate.

Next, the results of the calculations of the plasma density distribution in the case where the slot width W is small will be shown. The calculations were carried out, with R1 being 45 mm, R2 being 140 mm, W being 20 mm, and H1 being 85 mm. At this time, $W\theta1/\lambda$ is 0.18, and the INDEX corresponding thereto read from FIG. 7 is approximately 0.33. The reference value 0.1 of INDEX, which is established as the reference in the present embodiment, is significantly exceeded, so that it is expected that the microwaves will be diffracted in the slot 28 and the microwaves will be introduced also to the central axis of the plasma processing chamber 12.

Figure 10:
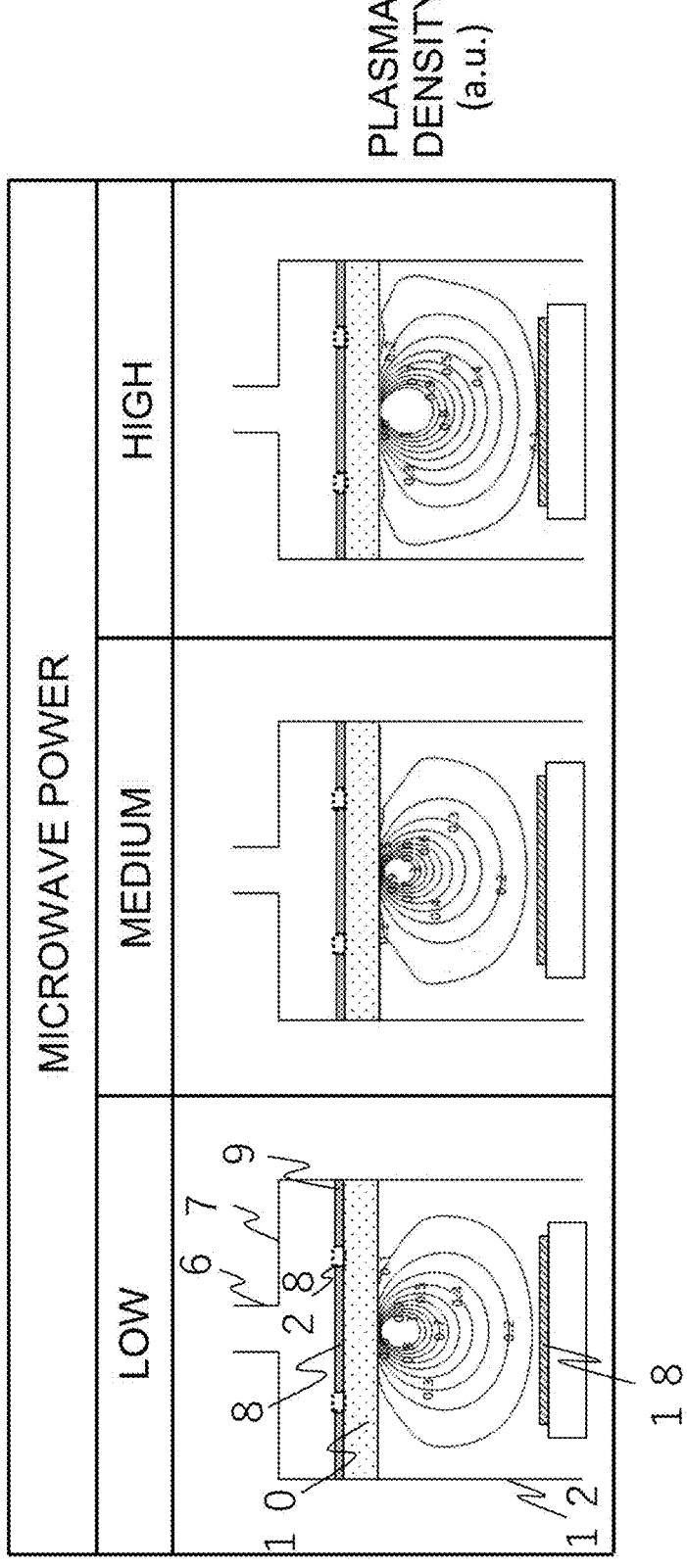
FIG. 10 is a diagram illustrating the calculation results of plasma density distribution in the case where a slot width is small.

FIG. 10 illustrates the plasma densities inside the plasma processing chamber 12 under the conditions described above. The type of gas, the pressure, and the microwaves used for calculations were the same conditions as those of the example of FIG. 9. From FIG. 10, it is clearly seen that localized plasma is generated in the vicinity directly below the microwave introduction window 10 and the central axis thereof.

From FIG. 10, it is seen that when the slot width W is narrow, microwaves passing through the slot 28 inconveniently wrap around the central part of the plasma processing chamber 12, causing plasma to be locally generated at the central part. In addition, it is seen that the plasma distribution is high at the center also in the wafer under the contour diagram of FIG. 10. Further, even if the microwaves are changed, the plasma remains localized at the central part, making it clear that there is no function as a control knob for adjusting the radial distribution of plasma as illustrated in FIG. 9. Based on the above, preferably, the dimensions of the slot 28 and the like are properly set in order to supply microwaves outward in the radial direction. Even with the slot width W indicated in FIG. 10, depending on the pressure inside the processing chamber, the plasma density spreads outward in the radial direction, resulting in a ring-shaped plasma distribution in some cases.

Second Embodiment

Figure 11:
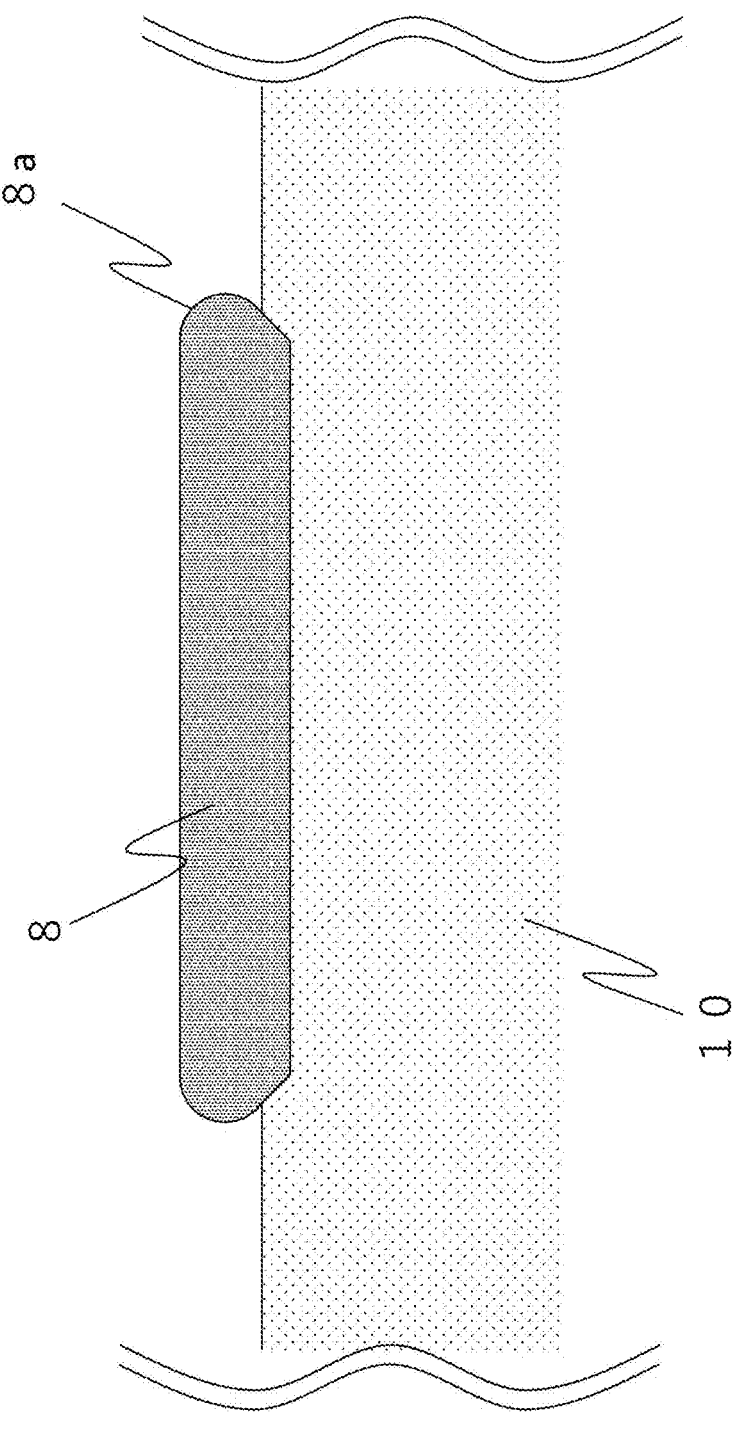
FIG. 11 is an enlarged sectional view illustrating the sectional shape of an inner conductive plate according to a second embodiment of the present invention.

As a second embodiment, in the etching apparatus of the first embodiment, a preferred shape of the inner conductive plate 8 for suppressing the diffraction of microwaves will be described. FIG. 11 is an enlarged sectional view of the microwave introduction window 10 and the inner conductive plate 8.

As has been described with reference to FIG. 2D, the microwave introduction window 10 has a stepped portion having a concave tapered outer peripheral surface, and the lower outer peripheral portion of the inner conductive plate 8 has a convex tapered shape that matches (fits) the stepped portion. In the present embodiment, the section of the upper edge of the outer periphery of the inner conductive plate 8 is shaped with a curvature. In other words, the upper surface and the side surface of the inner conductive plate 8 are connected through a curved surface 8a. In general, if the propagation path of electromagnetic waves has a sharp end, the electromagnetic waves are easily diffracted, which is known as knife edge diffraction. In order to suppress such knife edge diffraction, it is effective to eliminate a sharp corner by providing a curvature as illustrated in FIG. 11.

Third Embodiment

Figure 12:
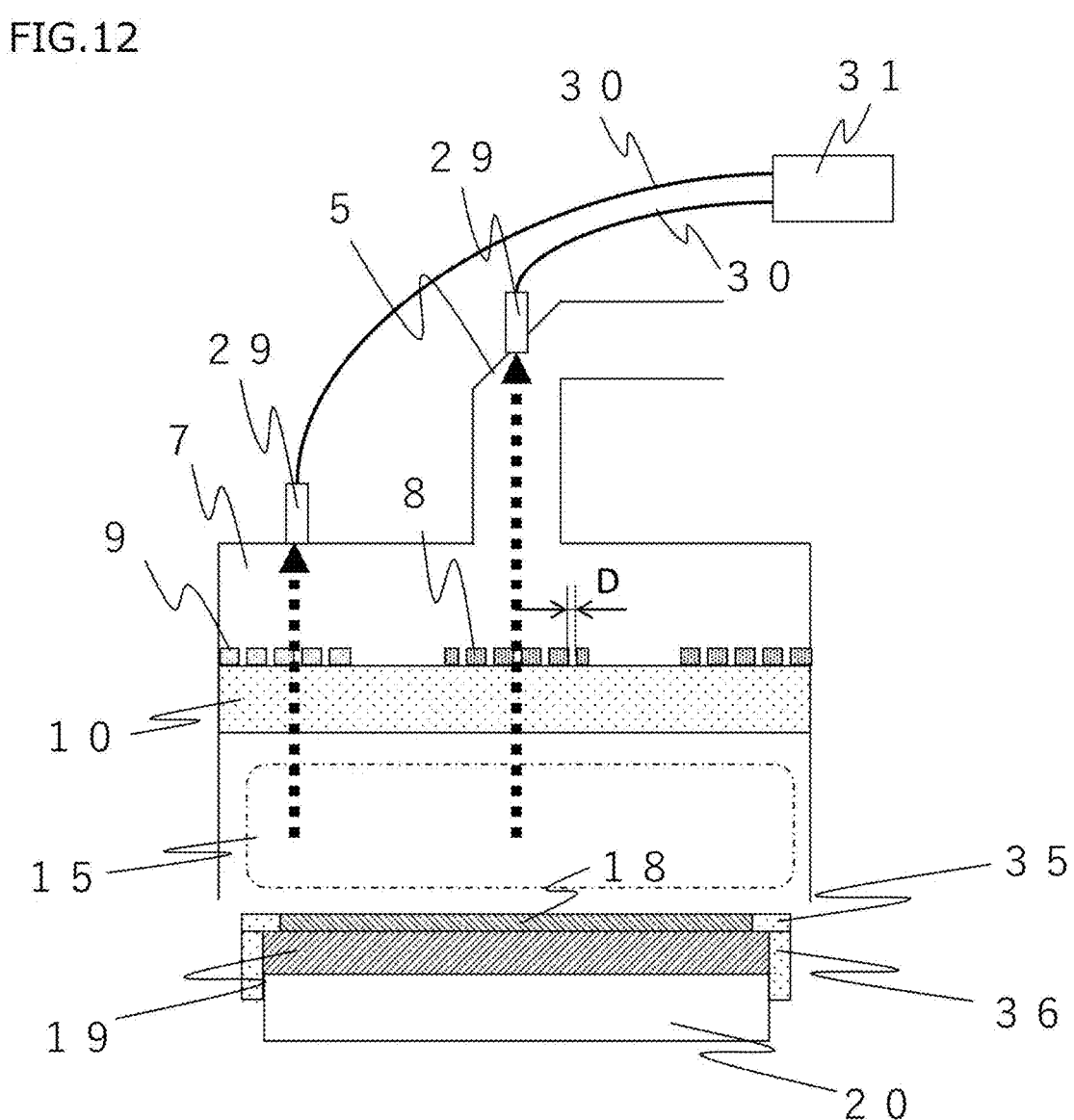
FIG. 12 is an enlarged sectional view of an area around a cavity unit according to a third embodiment of the present invention.

As a third embodiment, in the etching apparatus of the first embodiment, a preferred configuration for monitoring the light emission from the plasma processing chamber 12 and the substrate to be processed 18 will be described. FIG. 12 is an enlarged sectional view of the structure of an area around the cavity unit 7 and the microwave introduction window 10.

Numerous openings are formed in the inner conductive plate 8 and the outer conductive plate 9. An opening diameter D of each of the openings is set to be sufficiently small with respect to the wavelength of a microwave such that the inner conductive plate 8 and the outer conductive plate 9 do not allow microwaves to pass therethrough. For this reason, it is sufficient to set the opening diameter D to, for example, $\frac{1}{10}$ or less of the wavelength of a microwave. Consequently, microwaves do not pass through the openings of the inner conductive plate 8 and the outer conductive plate 9, but ultraviolet light and light in a visible light region from the plasma 15 and the substrate to be processed 18 are allowed to pass therethrough.

Alternatively, as long as the purpose of reflecting microwaves and transmitting light is satisfied, the inner conductive plate 8 and the outer conductive plate 9 may be transparent conductive films such as ITO electrodes. At this time, the thickness of the transparent electrode is preferably set to be equal to or more than a skin depth so as not to transmit microwaves.

In order to monitor the light emission of the plasma 15, a light emission spectroscope 31 is installed above the circular/rectangular converter 5 and the cavity unit 7 through the intermediary of a light receiver 29 and an optical fiber 30. Based on the radial distribution of the luminous intensity of the plasma 15 that has been obtained, the microwaves used in the plasma processing and the external magnetic field by the electromagnetic coils 13 are adjusted so as to obtain a desired radial density distribution of the plasma 15. Alternatively, the film thickness distribution of a film to be processed may be monitored by monitoring the interference light due to the reflected light on the front surface of the film to be processed of the substrate to be processed 18 and the reflected light on the back surface thereof.

Alternatively, based on the measured film thickness distribution, the microwave and the external magnetic field may be adjusted to perform plasma processing so as to obtain a desired film thickness distribution of a film to be processed. In the present embodiment, there are only two places where the light emission is measured; however, the number of the measurement places may be increased, as necessary.

Figures 13A, 13B:
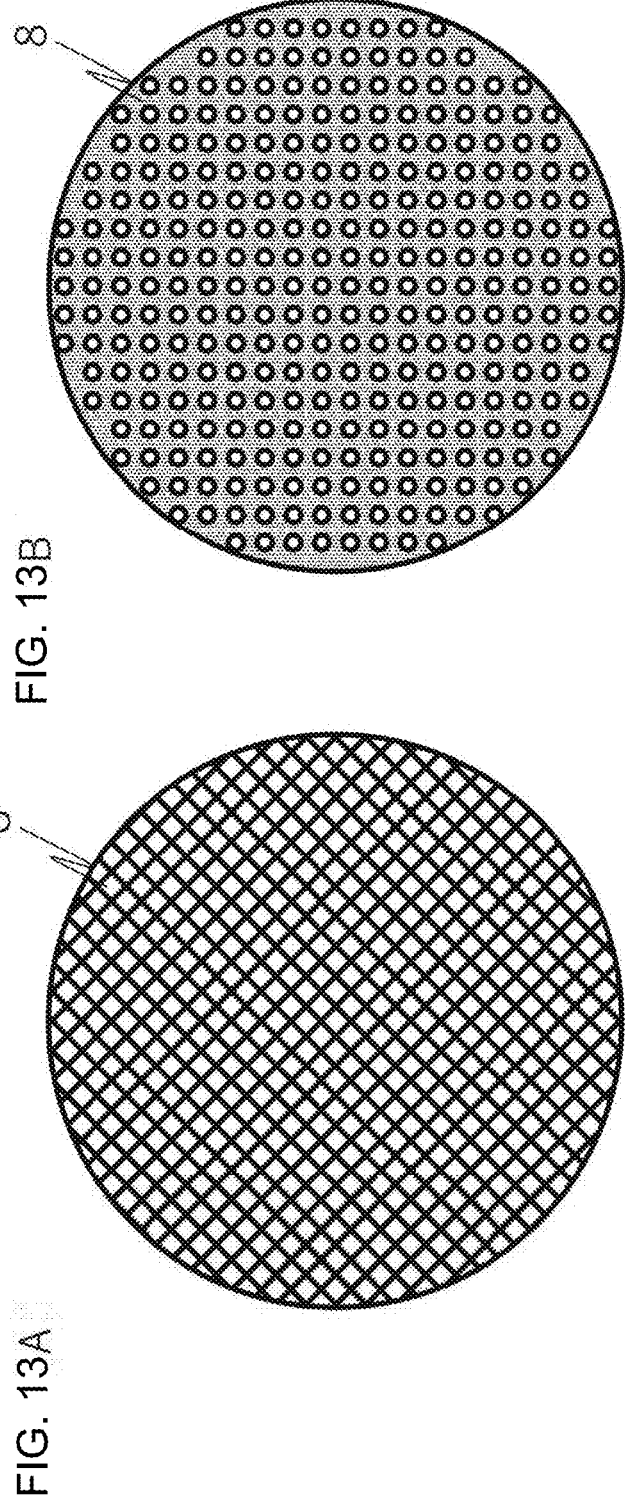
FIGS. 13A-13B present top views of an inner conductive plate according to the third embodiment of the present invention.

Structural examples of the inner conductive plate 8 having the openings are illustrated in FIGS. 13A-13B. FIGS. 13A-

13B present the top views of the inner conductive plate 8. In FIG. 13A, the inner conductive plate 8 is formed like a mesh (mesh structure) by intersecting thin metal wires. In FIG. 13B, the inner conductive plate 8 is made of perforated metal with numerous openings (through-hole openings) in a metal plate.

The mesh-like inner conductive plate 8 in FIG. 13A is effective for reducing the risk of damage to the microwave introduction window 10 and the spacer 25 caused by thermal expansion. For example, a case is assumed where the outer peripheral portion of the inner conductive plate 8 is surrounded by the stepped portion of the microwave introduction window 10 and the spacer 25 as illustrated in FIGS. 2(B) and (C). At this time, even if the inner conductive plate 8 is thermally expanded, the inner conductive plate 8 can be shrunk due to the elasticity of the fine wire of the mesh, thus suppressing the risk of damage to the stepped portion caused by the thermal expansion.

In the inner conductive plate 8 of the perforated metal in FIG. 13B, in order to reduce the risk of damage due to the difference in thermal expansion, it is desirable that the stepped portion has an outer peripheral surface of a slanted concave tapered shape, and the outer peripheral portion of the perforated metal has a convex tapered shape that matches the stepped portion, as illustrated in FIG. 2D.

Fourth Embodiment

Figure 14:
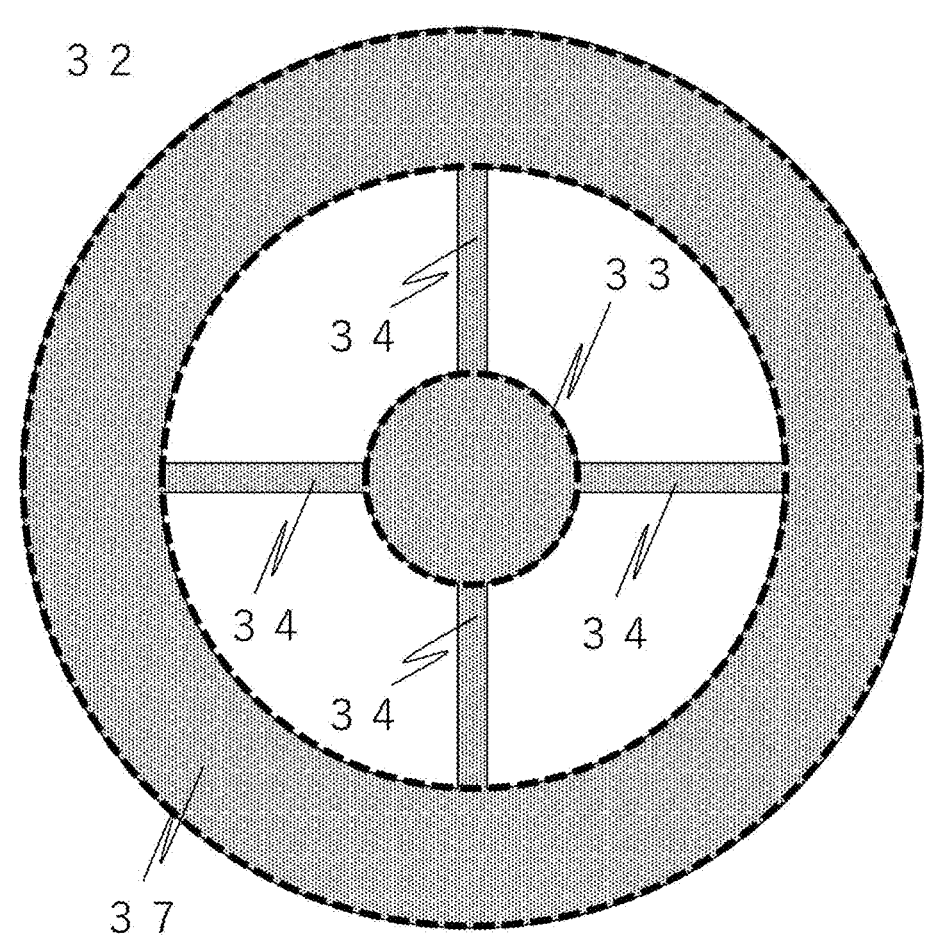
FIG. 14 is a top view illustrating the structure of a conductive plate in an etching apparatus according to a fourth embodiment of the present invention.

In a fourth embodiment, different forms of the inner conductive plate 8 and the outer conductive plate 9 in the first embodiment will be described. FIG. 14 illustrates a structure in which the inner conductive plate 8 and the outer conductive plate 9 in the first embodiment are integrated into a conductive plate 32 composed of an inner circular region 33, support sections 34, and an outer circular region 37. In other words, it can be said that the conductive plate 32 has the inner conductive plate and the outer conductive plate integrated by being connected through the intermediary of the support sections 34.

In this configuration, the inner circular region 33 is fixed by the support sections 34, thus eliminating the need for considering the deviation of the inner conductive plate 8 from the central axis, as described in the first embodiment. In other words, there is no need for the stepped portion and the spacer for fitting the inner conductive plate 8 to the microwave introduction window 10.

Further, in the first embodiment, the inner conductive plate 8 is inconveniently floated electrically, while in the present embodiment, the conductive plate 32 is at the same potential, so that it is possible to prevent the conductive plate 32 from being charged by bringing the outer peripheral portion of the conductive plate 32 and the cavity unit 7 into contact with each other and by grounding the cavity unit 7.

Although there are four support sections 34 in the present embodiment, the number of the support sections 34 does not have to be four if the purpose is to support the inner circular region 33. In addition, although the support sections 34 have a linear shape, any shape may be used as long as the shape satisfies the purpose of supporting and does not interfere with the transmission of microwaves.

Fifth Embodiment

Figure 15:
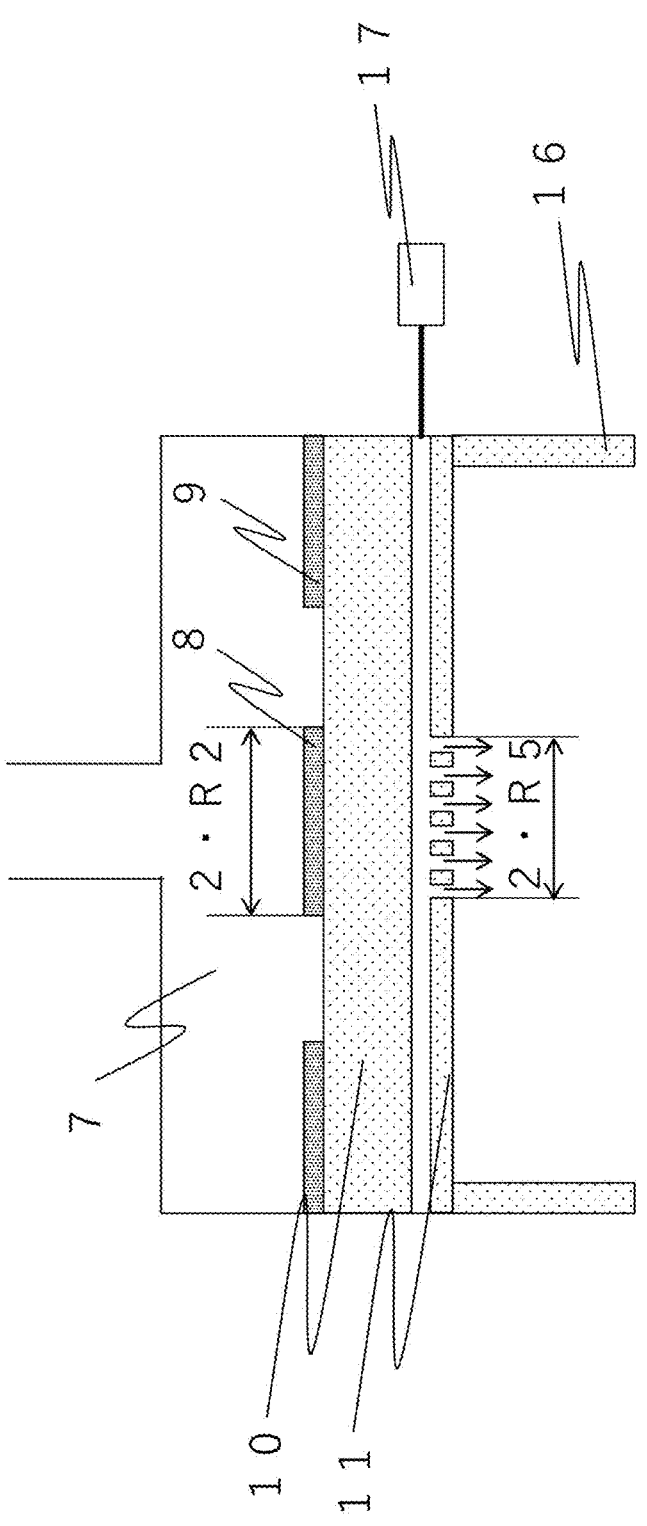
FIG. 15 is an enlarged sectional view of an area around a shower plate according to a fifth embodiment of the present invention.

In the fifth embodiment, a preferred relationship between the radius of an inner conductive plate 8 and the gas introduction region of a shower plate 11 will be described. FIG. 15 is an enlarged sectional view of the area around the shower plate 11. The radius of the inner conductive plate 8 is denoted by R2 and the radius of the gas introduction region (the circle in contact with the gas supply hole positioned on the outermost circumference among the gas supply holes) in which there are the gas supply holes in the shower plate 11 is denoted by R5.

In the case where the propagation path of microwaves has the gas supply holes of the shower plate 11, discharge may occur inside the gas holes depending on microwaves or processing pressure. At this time, the etching rate may locally increase on a wafer and the uniformity of plasma processing may deteriorate.

As described in the first embodiment, microwaves propagate to the plasma processing chamber 12 outward in the radial direction through the slot 28, and it is difficult for the microwaves to propagate to the inner side beyond directly under the inner conductive plate 8 and the diameter of the inner conductive plate 8. Consequently, if R5<R2, then there will be no gas holes of the shower plate in the microwave propagation path, thus reducing the risk of the deterioration of plasma processing uniformity attributable to gas hole discharge.

INDUSTRIAL APPLICABILITY

The present invention can be applied to a plasma processing apparatus adapted to process a sample on a substrate, such as a semiconductor wafer, by etching or the like.

DESCRIPTION OF REFERENCE NUMERALS

1 . . . microwave source; 2 . . . rectangular waveguide; 3 . . . isolator; 4 . . . automatic matching unit; 5 . . . circular/rectangular converter; 6 . . . circular waveguide; 7 . . . cavity unit; 8 . . . inner conductive plate (circular conductor); 9 . . . outer conductive plate (ring-shaped conductor); 10 . . . microwave introduction window; 11 . . . shower plate; 12 . . . plasma processing chamber; 13 . . . electromagnetic coil (magnetic field forming mechanism); 14 . . . yoke; 15 . . . plasma; 16 . . . inner cylinder; 17 . . . gas supply unit; 18 . . . substrate to be processed (sample); 19 . . . substrate stage/radio frequency electrode; 20 . . . insulating plate; 21 . . . conductance adjustment valve; 22 . . . turbo molecular pump; 23 . . . automatic matching unit; 24 . . . bias power supply; 25 . . . spacer; 26 . . . pin; 27 . . . screw; 28 . . . slot; 29 . . . light receiver; 30 . . . optical fiber; 31 . . . light emission spectroscope; 32 . . . conductive plate; 33 . . . inner circular region; 34 . . . support section; 35 . . . susceptor; and 36 . . . stage cover.

The invention claimed is:

1. A plasma processing apparatus comprising:
a processing chamber in which a sample is subjected to plasma processing, including, at an upper side therein, a dielectric plate through which a microwave is transmitted;
a radio frequency power supply which supplies radio frequency power for the microwave;
a cavity resonator which resonates the microwave transmitted from the radio frequency power supply through a waveguide and is placed above the dielectric plate;
a magnetic field forming mechanism which forms a magnetic field in the processing chamber;

a ring-shaped conductor disposed inside the cavity resonator; and
a circular conductor which is disposed inside the cavity resonator in an opening formed at a center of the ring-shaped conductor,
wherein the ring-shaped conductor and the circular conductor are constructed to form a slot disposed therebetween,
wherein the circular conductor is configured to be independently moveable with respect to the ring-shaped conductor, and
wherein the circular conductor has a convex tapered shape that fits to a concave tapered shape formed in the dielectric plate.

2. The plasma processing apparatus according to claim 1, wherein the slot has a width which suppresses diffraction of the microwave from occurring in a direction causing generation of plasma in a central portion of the processing chamber.

3. The plasma processing apparatus according to claim 1, wherein an upper surface and a side surface of the circular conductor are connected by a curved surface.

4. The plasma processing apparatus according to claim 3, wherein the circular conductor is a conductor which has a metal plate having a plurality of through openings, or a mesh structure.

5. The plasma processing apparatus according to claim 1, wherein a radius of the circular conductor is larger than a radius of a circular waveguide connected to a top of the cavity resonator.

6. The plasma processing apparatus according to claim 2, wherein a radius of the circular conductor is larger than a radius of a circular waveguide connected to a top of the cavity resonator.

7. The plasma processing apparatus according to claim 2, further including:
a gas supply plate which has, at a central part thereof, a plurality of gas supply holes for supplying a gas to the processing chamber, and which is placed under the dielectric plate,
wherein in the case where a height of the cavity resonator is denoted by HA, a thickness of the dielectric plate and the gas supply plate is denoted by HB, a relative permittivity of the dielectric plate and the gas supply plate is denoted by er, and a radius of the processing chamber is denoted by RB, a radius RC of the ring-shaped conductor satisfies a relational expression given below:

$$RC \leq RB - HB/(\varepsilon r\ (1+(HA/RB)^2)-1)^{(1/2)}.$$

8. The plasma processing apparatus according to claim 2, further including:
a gas supply plate which has, at a central part thereof, a plurality of gas supply holes for supplying a gas to the processing chamber, and which is placed under the dielectric plate,
wherein in the case where the circular conductor and the gas supply plate are viewed in an axial direction of the circular conductor, a radius of the circular conductor is larger than a radius of a circle in contact with a gas supply hole positioned on an outermost circumference among the gas supply holes.

* * * * *